US007702116B2

(12) United States Patent
Stone et al.

(10) Patent No.: US 7,702,116 B2

(45) Date of Patent: Apr. 20, 2010

(54) MICROPHONE BLEED SIMULATOR

(76) Inventors: Christopher L. Stone, 5258 Twin Oaks Rd., Hidden Hills, CA (US) 91302-2416; Gary D. Davis, P.O. BOX 26689, Los Angeles, CA (US) 90026-0689

( * ) Notice: Subject to any disclaimer, the term of this patent is extended or adjusted under 35 U.S.C. 154(b) by 1276 days.

(21) Appl. No.: 11/208,798

(22) Filed: Aug. 22, 2005

(65) Prior Publication Data

US 2007/0041586 A1 Feb. 22, 2007

(51) Int. Cl.
*H03G 3/00* (2006.01)

(52) U.S. Cl. ............................ 381/63; 381/17; 381/61; 381/92

(58) Field of Classification Search ..................... 381/1, 381/17–18, 26, 91–92, 122, 61–63, 119, 381/118; 700/94; 84/625, 630, 660, 707
See application file for complete search history.

(56) References Cited

U.S. PATENT DOCUMENTS

| | | | | |
|---|---|---|---|---|
| 4,332,979 | A | 6/1982 | Fischer | |
| 6,188,769 | B1 * | 2/2001 | Jot et al. | 381/63 |
| 6,904,152 | B1 | 6/2005 | Moorer | |
| 7,474,753 | B2 * | 1/2009 | Araya et al. | 381/63 |
| 2002/0106986 | A1 * | 8/2002 | Asada et al. | 455/3.01 |
| 2003/0007648 | A1 | 1/2003 | Currell | |

OTHER PUBLICATIONS

International Search Report for PCT/US06/32607 dated Aug. 28, 2007.

* cited by examiner

*Primary Examiner*—Xu Mei
*Assistant Examiner*—Disler Paul
(74) *Attorney, Agent, or Firm*—Nixon Peabody LLP.; Joseph Bach

(57) ABSTRACT

The invention is a microphone bleed simulator which processes the audio signals recorded with one spot microphone and one room mic (or one spot mic alone) and simulates the sound that would be created in a typical studio recording environment wherein multiple spot microphones and multiple room microphones distributed throughout that environment all pick up sounds from any given sound source. Such multiple microphone contributions to the mixed sound are what imbue actual recordings with much of their characteristic sound quality and sense of realism, and what make recordings of ensemble instruments sound as though the players were performing together in one place. The system and method of the invention artificially simulates this natural microphone bleed and provides the means to create scaleable, realistic multi-channel sound mixes in formats such as stereo, 5.1 and 7.1 surround. The invention is particularly well suited to processing sampled or synthesized sound.

5 Claims, 15 Drawing Sheets

Instructions for Spot Mic Simulator (130)

| ID | Element | Value | ID | Element | Value | ID | Element | Value |
|---|---|---|---|---|---|---|---|---|
| 130a | 203 | on | 130g | 203 | on | 130m | 203 | on |
| | 205 | 290 | | 205 | 360 | | 205 | 90 |
| | 207 | 20,000 | | 207 | 6,000 | | 207 | 4,000 |
| | 209a | 0 | | 209a | 14.5 | | 209a | 29.1 |
| | 209b | 0.003 | | 209b | 14.505 | | 209b | 29.104 |
| | 209c | 18 | | 209c | 14 | | 209c | 12 |
| | 211 | 0/- | | 211 | 0/- | | 211 | 0/- |
| | 213 | 0 | | 213 | 14.5 | | 213 | 20.6 |
| 130b | 203 | on | 130h | 203 | on | 130n | 203 | on |
| | 205 | 120 | | 205 | 360 | | 205 | 45 |
| | 207 | 12,000 | | 207 | 5,000 | | 207 | 3,500 |
| | 209a | 16.4 | | 209a | 22 | | 209a | 33.3 |
| | 209b | 16.403 | | 209b | 22.002 | | 209b | 33.302 |
| | 209c | 17 | | 209c | 14 | | 209c | 11 |
| | 211 | 0/- | | 211 | 0/- | | 211 | 0/- |
| | 213 | 15.6 | | 213 | 18.1 | | 213 | 21.7 |
| 130c | 203 | on | 130i | 203 | on | 130o | 203 | on |
| | 205 | 125 | | 205 | 360 | | 205 | 200 |
| | 207 | 8,000 | | 207 | 4,000 | | 207 | 2,500 |
| | 209a | 32.7 | | 209a | 35.9 | | 209a | 43.7 |
| | 209b | 32.703 | | 209b | 35.905 | | 209b | 43.705 |
| | 209c | 16 | | 209c | 12 | | 209c | 10 |
| | 211 | 0/- | | 211 | 0/- | | 211 | 0/- |
| | 213 | 21.6 | | 213 | 22.4 | | 213 | 24.1 |
| 130d | 203 | on | 130j | 203 | on | | | |
| | 205 | 280 | | 205 | 45 | | | |
| | 207 | 14,000 | | 207 | 4,500 | | | |
| | 209a | 7.3 | | 209a | 21.8 | | | |
| | 209b | 7.302 | | 209b | 21.802 | | | |
| | 209c | 16 | | 209c | 12 | | | |
| | 211 | 0/- | | 211 | 0/- | | | |
| | 213 | 8.5 | | 213 | 18.1 | | | |
| 130e | 203 | on | 130k | 203 | on | | | |
| | 205 | 330 | | 205 | 30 | | | |
| | 207 | 10,000 | | 207 | 4,000 | | | |
| | 209a | 18 | | 209a | 27.2 | | | |
| | 209b | 18.004 | | 209b | 27.205 | | | |
| | 209c | 16 | | 209c | 11 | | | |
| | 211 | 0/- | | 211 | 0/- | | | |
| | 213 | 16.4 | | 213 | 20 | | | |
| 130f | 203 | on | 130l | 203 | on | | | |
| | 205 | 330 | | 205 | 20 | | | |
| | 207 | 7,500 | | 207 | 3,000 | | | |
| | 209a | 35.9 | | 209a | 39.3 | | | |
| | 209b | 35.904 | | 209b | 39.304 | | | |
| | 209c | 15 | | 209c | 11 | | | |
| | 211 | 0/- | | 211 | 0/- | | | |
| | 213 | 21.8 | | 213 | 23.2 | | | |

Instructions for Room Mic Simulator (132)

| | Element | Value |
|---|---|---|
| 132a | 403 | on |
| | 405 | 360 |
| | 407 | 10,000 |
| | 409a | 0 |
| | 409b | 0.003 |
| | 409c | 24 |
| | 411 | 0/- |
| | 413 | 0 |
| 132b | 403 | on |
| | 405 | 360 |
| | 407 | 8,000 |
| | 409a | 1.5 |
| | 409b | 1.510 |
| | 409c | 20 |
| | 411 | 0/- |
| | 413 | 0.8 |
| 132c | 403 | on |
| | 405 | 360 |
| | 407 | 6,000 |
| | 409a | 5.90 |
| | 409b | 5.917 |
| | 409c | 18 |
| | 411 | 0/- |
| | 413 | 2.7 |
| 132d | 403 | on |
| | 405 | 360 |
| | 407 | 4,000 |
| | 409a | 9.5 |
| | 409b | 9.523 |
| | 409c | 16 |
| | 411 | 0/- |
| | 413 | 4.5 |
| 132e | 403 | on |
| | 405 | 360 |
| | 407 | 3,500 |
| | 409a | 16.00 |
| | 409b | 16.018 |
| | 409c | 14 |
| | 411 | 0/- |
| | 413 | 6.3 |

Instructions for Surround Simulator (142)

| Element | 142a | Element | 142b |
|---|---|---|---|
| 805a | on | 805b | on |
| 807a | 3,000 | 807b | 3,000 |
| 809a | 20.1 | 809b | 32.2 |
| 811a | 7.8 | 811b | 11 |

Fig. 14

Instructions for Main Output Mixer (134)

| Element | 134a | 134b | 134c | 134d | 134) |
|---|---|---|---|---|---|
| 601a | on | off | off | off | off |
| 601b | on | off | off | off | off |
| 601c | on | off | off | off | off |
| 601d | off | on | off | off | off |
| 601e | off | on | off | off | off |
| 601f | off | on | off | off | off |
| 601g | off | off | on | off | off |
| 601h | off | off | on | off | off |
| 601i | off | off | on | off | off |
| 601j | off | off | off | on | off |
| 601k | off | off | off | on | off |
| 601l | off | off | off | on | off |
| 601m | off | off | off | off | on |
| 601n | off | off | off | off | on |
| 601o | on | off | off | off | on |
| 605 | 0.0 | 8.5 | 14.5 | 18.1 | 20.6 |
| 607a | on | off | off | off | off |
| 607b | off | on | off | off | off |
| 607c | off | off | on | off | off |
| 607d | off | off | off | on | off |
| 607e | off | off | off | off | on |
| 611 | 0.0 | 0.8 | 2.7 | 4.5 | 6.3 |

Fig. 15

MICROPHONE BLEED SIMULATOR

TECHNICAL FIELD

This invention relates to the field of microphone bleed simulation for manipulation of apparent source position and environment.

BACKGROUND OF THE INVENTION

This invention relates to the recording of orchestral sounds, choirs, or any type of music or sound effect and to the subsequent playback in a manner that simulates a particular position on a sound stage and particular features thereof (such as size, shape and acoustics). By way of example, the invention can be used to recreate the sound of a conventional symphonic recording setup that uses numerous spot microphones and five to seven surround sound (sometimes called "Decca Tree") microphones.

As little as one microphone and one channel of actual audio for sound storage (in digital or analog format) of each individual sound source may be used. Multiple sources (e.g., multiple instruments within an orchestra) are recorded individually and stored discretely on recording media. The invention is particularly well suited for use with a multiplicity of sound sources which are distributed around a real or virtual environment, and for reproduction of the sounds made by those sources on an expanded stereo or a 7.1 stereo surround sound system (although it is suitable also for fewer or more reproduction channels).

Unlike conventional reverberation and spatial effects systems that are entirely post-production oriented, meaning they are used after sound is recorded, this invention may benefit from a specific microphone placement and recording technique used in conjunction with specialized processing upon playback. As a result, the invention may capture the sound quality of a recorded space, and it may permit continuously variable control of the size and liveliness of the apparent recording environment.

The invention enhances the quality and controllability of sampled sound libraries, and it is also applicable to many other situations where one wishes to have real-time, continuously variable control of the apparent size of the acoustic sound field upon playback of recorded or synthesized sound. The invention is applicable for both studio production use as well as for live performances of sampled or synthesized music and for computer gaming. It can also be applied to benefit broadcast and other means of sound distribution such as CD, DVD, Internet and other means, including future means, of audio distribution, storage and reproduction.

Many years ago, recordings for home listening were made in simple 2-channel (left-right) stereo. (This, of course, was subsequent to the "ancient" monaural days.) For sound reproduction in motion picture theaters, a center channel was added to the stereo channels to keep the "audio image" from appearing to drift. So, theatrical recordings were made in 3-channel (left-center-right) stereo. Then along came 5-channel stereo recording that created expanded stereo for wide-screen presentations (adding far left and far right to the left-center-right sound field). (Other channel allocations and speaker placements were used as well.) A "subwoofer" or very low bass channel was added, and this arrangement can be referred to as 5.1 (pronounced "five-dot-one") expanded stereo. Typically in 5.1 expanded stereo sound production, the subwoofer channel is artificially created from the 5-channel stereo mix, although special effects can be added to the subwoofer channel (such as rumble to simulate rocket engines, explosions, earthquakes and so forth). Left and right rear speakers have also been added. These rear speakers are often referred to as "surround" speakers and the audio channel feeds to them are referred to as "surround" channels. In many motion picture theaters today, there are three speakers (a left speaker, a center speaker and a right speaker) behind the projection screen (i.e., at the front of the auditorium), a subwoofer (low frequency speaker) usually in front and below the screen, and two speakers in the rear of the auditorium (a left rear (or left surround) speaker and a right rear (or right surround) speaker), with a separate audio channel feeding each speaker. This system is usually referred to as a "5.1 stereo surround" system or simply a "5.1" system. Many home theater systems emulate the motion picture theater systems and 5.1 stereo surround has become a standard for high-quality motion picture soundtracks and digital video disc (DVD) soundtracks.

Some high-end productions are being released in 7.1 ("seven-dot-one"), adding far left and far right channels to the behind the screen speakers. Some are experimenting with other formats involving different numbers of channels.

In the prior art recording of orchestras, for greater realism and ease of production, symphonic recording sessions would be done in a very large room with 50 to 100 musicians all playing as though they were in a live concert. This assembly of musicians typically would be recorded using from 15 to 25 microphones ("mics"). The audio signals from the mics would be mixed down (combined) to fewer channels, which channels were ultimately preserved on discrete tracks of a professional digital or analog recording system.

This "ideal" situation is seldom available, and more frequently symphonic recordings (such as for motion picture soundtrack scoring) are made with sections of about 10 instruments at a time in multiple recording sessions. The effect of a "full orchestra" is created by mixing together the results of these multiple sessions. This compromise is made primarily to avoid the high cost of hiring a large orchestra and of renting a large enough studio or hall in which to record it. Using a process called overdubbing, a musician can listen in headphones to previously recorded portions of the program while recording additional material, thus allowing the musician to synchronize his/her playing and to control the timber and volume of the instrument similarly to what would naturally occur in a full orchestra environment. Thus, one musician can, in sequence, play several parts or different instruments. However, the overdubbing process does not provide the same sonic quality as can be achieved with all members of the orchestra actually present at once in a large space.

Despite the pressure for economy, the need for superb sonic quality has not diminished, especially for large-sounding motion picture (or television) scores. There is still a demand for the "large sound."

Primarily in response to the high cost of live musical scoring, digitally sampled music technology has been taking over the recording industry. Using sampling technology, a library of recorded instrument sounds can be played to create soundtracks without the need for any (or at least not as many) live players. The libraries are played using digital devices known as samplers, which may be embodied as computer programs, or the samplers may be embodied in dedicated hardware systems. Unfortunately, there are myriad difficulties when using today's sample libraries or even using synthesizers.

The overall systems (library and sampler) seldom deliver their promised realism, economy, or simplicity of use. Many sampled instrument libraries only go as far as 2-channel stereo, although some have been created to satisfy the 5.1 format. The 7.1 format has not yet been tackled by samplers, and even the latest releases of 5.1 libraries pose serious technical and performance issues in practical application only a handful of libraries sold in recent years are entirely new productions, with most libraries using at least some reworked recordings from older, poorer quality libraries. Since leading-edge sound quality is difficult to find in samplers, and is not uniform across the sounds offered, and since the 5.1 sampler systems are either too complex or just plain fail to function satisfactorily when pressed to the limit (i.e., recreating the sound of about one hundred different instruments at a time to simulate a full orchestra), simple 2-channel stereo libraries have continued to sell. In other words, there is a large gap between what the market would like to have at its disposal, and what is practically achievable from currently available products.

To extend the utility of 2-channel stereo libraries, end users have attempted to simulate the 5.1 surround sound environment by using 5.1 surround reverb software programs. Typical embodiments would be the plug-in software "processors" like those sold by Lexicon of Sandy, Utah or TC Electronics of Risskov, Denmark, and intended for use with ProTools™ software/hardware platforms of Digidesign, a division of Avid Technology, Inc., of Daly City, Calif. Although these are useful tools, they do not accurately simulate the sound of multiple microphones picking up all the instruments during a live recording session in a single space (such as an auditorium or studio).

Today's hardware-based and software-based 5.1 reverbs treat each signal as though it were being picked up by five room microphones, typically in a so-called "Decca Tree" configuration. A Decca Tree arrangement usually consists of five microphones many feet above and in front of the sound source (three in a frontal triangle plus added far left and far right microphones). This arrangement was first popularized in Decca Records' London studios many years ago. Other arrangements of five microphones are simply known as 5-channel sound. Such reverbs do not simulate the additional spot microphones that are present during recordings of a full complement of musicians in a larger (or even in a smaller) recording studio or hall.

The difference between typical 5.1 reverb-processed surround and live 5.1 surround recording must be understood in order to appreciate all that the invention described herein does to advance the state of the art. Reference here is made to FIG. 10, which includes an overhead view of a traditional live orchestra arrangement for over a hundred musicians playing an even greater number of instruments 22 (including violins, flutes, brass, percussion and so forth), which are depicted in the drawing as rectangular and circular shapes, positioned in the orchestral stage portion 32 of a recording studio 34 (which could be a concert hall). Spot mics 24 are distributed throughout the area of the sound stage where the orchestra is positioned, and room mics 26 are positioned near the front of the orchestra and significantly higher than the spot mics. The spot mics are typically directional mics and primarily pick up the sonic character of the instruments near them. In FIG. 10 twenty five spot mics are shown, which would be within the range typically used for recordings of a full orchestra. The room mics are typically omni directional mics and pick up more of the sound of the environment as well as the blended sound of many instruments. In FIG. 10, seven room mics 26 are shown. One each is positioned, respectively, at the far left, left, center, right and far right above the front of the orchestral stage (which is coincident with the front of the part of the studio representing the audience area 36). The two remaining room mics are positioned to the far left and far right of the rear of the audience area 36. These two remaining mics are intended to pick up the sounds which would reverberate from the rear of the audience area 36.

During a live orchestral recording session, each microphone, including each of the spot mics 24 and room mics 26 in the studio (or on stage), picks up sounds from all the instruments present. This "mic bleed" is what gives live ensemble recordings a feeling of space and depth as well as the impression that all the musicians were playing in the same location at once. This is true whether the recording is for a full performance of a musical program or whether it is for the purpose of deriving digital samples that capture the sound of the studio or hall. Orchestral recording is discussed here because it is among the most complex and challenging, but the descriptions apply equally to almost any kind of sound recording. The five front room microphones (far left—left—center—right—far right) are located high in the air and near the front of the orchestra, and they serve to capture much of the sound of the studio (or hall) as well as of the orchestra itself (or the sound of a section of the orchestra if the recording is being done with a subgroup of musicians), but the room or surround mics are not the only mics contributing to the recording. Numerous spot mics which are placed lower and closer to specific instruments or instrument sections, are mixed into the overall recording at which time they are panned to the appropriate left-to-right location in the stereo sound field.

Many recording engineers have tried to use only or primarily the room microphones (typically in a "Decca Tree" microphone array or some variation thereof) to capture the entire performance, but they have generally found the results to be unsatisfactory. Such room-mic-only recordings can seem "muddy" or lacking in clarity and definition. The "presence" (i.e., the midrange/high frequency spectral content) of any given sound source is better captured by a nearby microphone, and that is why spot mics are almost always used in conjunction with room mics to achieve satisfactory results. However because the room and spot mics are picking up the same sound but in different locations, there often are phase-related sonic cancellations, which make it very difficult to optimize the placement and mixing of the various mics. Among its other benefits, the invention controls this phase cancellation problem.

Typically, in prior art methods, which pick up sounds that are to be similarly panned, spot mics are sub-mixed into "stems" (in which case each spot mic is not recorded discretely, but instead is recorded along with other spot mics as part of a group or stem). This means that existing master recordings are generally unsuitable for use with this invention, as will become evident once the method of this invention is understood. Although the microphone closest to one instrument will predominantly pick up the sound of that instrument, it also picks up the sound of every other instrument playing, the phenomenon previously mentioned as "mic bleed." The bleed sound from more distant instruments is usually detected at a lower volume level than the sound of the instrument(s) nearest to a given spot mic due to normal acoustic attenuation over distance. Also, because sound travels at a finite speed (about 1.1 feet per millisecond), the sound from a particular source reaches the spot mic nearest it sooner than its sound reaches a remotely spaced spot mic. Additionally, the sound arriving at the remotely spaced spot mic is diminished in high frequency content due to the differential attenuation of higher frequencies by the air itself. Thus the spectral balance of an instrument in the bleed sound picked up by each more distant spot mic is not the same as sound picked up by the spot mic nearest to the instrument. The more distant a sound source is from a given spot mic, the more reverberation is present (rapid, blended sound reflections primarily from sound bouncing off the floor, ceiling and walls). Such reverberation decays more slowly than the direct sound from the sound source. Also, the orientation of each spot mic (or room mic, for that matter) with respect to a given sound may differ, introducing additional phase shift with respect to that same sound as it is sensed by each of the various mics. Thus, the bleed in different spot mics comprises different "versions" of the sound from a given source, depending largely upon the spot mic distance from the source. With each instrument (or other sound source) bleeding into all the other spot microphones, the overall captured sound field from all these spot mics imbues a "color" and a recognizable characteristic to the recorded sound, one that gives the impression of a particular sized recording space.

The sound mix of all the spot mics provides most of the character and impression of size to a recording. The sounds recorded by the spot mics are enhanced by the elevated room microphones such as those in a Decca Tree. By way of example, if one records a single instrument in a large hall with only the nearest spot mic, and no other spot mics—that recording does not sound as spacious or appear to be as realistic as one recorded with all the typical spot mics and Decca Tree room mics contributing to the recording. In fact, it sounds almost as though it were recorded in a much smaller room. Adding conventional sound effects and reverberation processing will make the sound appear "larger" but cannot fully overcome the lack of realism and spaciousness, particularly when recording with multiple "spot-mic'd" sources. Even with a five room mic sound array added to the mix, the sound still lacks the depth and spaciousness that can be heard when all the spot mics and room mics pick up bleed from all the instruments and contribute this sound to the mix.

For prior art sampled sound, several obstacles arise for sampler playback if the samples were recorded with the typical 15 to 25 spot mics plus the 5 room mics picking up the orchestra (or any group of musicians or singers). The first and most obvious issue to anyone who has tried to use sample libraries is that the sound of the hall is "locked in" through this technique, particularly if the sample recording was done in a large space. In this instance, the long time delays and natural sound reflections in a large recorded space become part of the sampled sounds and cannot later be removed or altered appreciably. This is an insurmountable obstacle when one needs the sound of a smaller environment and the samples were recorded in a large environment. Going the other way, small studio recordings can be "stretched" somewhat through the addition of artificial reverberation and delay processing, but this does not accurately create the sound field achieved from mic bleed when spot microphones would be laid out further apart in a larger space. Because one does not have access to each spot microphone in a mixed-down multi-instrument sample recording (even if it is in 5.1 format), there is no way to alter the relationship of the spot mic contributions, nor do conventional reverbs provide means to simulate the way the spot mics function to create the impression of the live sound field.

When smaller numbers of musicians are recorded in smaller studios, as is more often the case today, the deficiency of not having the correct spot microphone scaling is especially evident. Many engineers, composers and musicians may be unaware of why the sound seems "too small" or incorrect, and so when they attempt to scale up the sound of a smaller studio using conventional 5.1 reverb embodied in software or hardware based systems, they find that no amount of conventional post-production reverberation effects can truly emulate the spaciousness of the sound which would have been achieved in the larger environment with the mic bleed. Even if they manage to come close to the "right sound" for one or a few instruments, the effect deteriorates when a whole section of instruments or an entire orchestra is processed—even using the most advanced 5.1 reverb systems. This inability to satisfactorily scale the orchestra (or other group) occurs because the individual instruments in the sample library lack the correct and unique spot mic "bleed" contributions; treating the sum of all the instruments with reverb processors as though they came from one (or even 5) locations simply cannot emulate what happens with an array of five or more room mics and a large array of many spot mics.

The inability to accurately and continuously scale the apparent size of the recorded space, particularly to make it smaller, is a drawback with conventional sample libraries and, as stated above, it is a deficiency that can barely be compensated using reverberation and effects processing. However, there is another major obstacle to the implementation of surround stereo recordings with sampler technology. That is, today's best full-orchestral library samplers with surround sound capability are difficult to set up and use. The means by which conventional samplers function to provide changes in the characteristics of notes played typically requires that several "versions" of a given note be loaded at once, multiplying the number of samples that must be processed in real time. Because the demand on computer resources rises and falls as a prior art sampler is played, the internal computer data busses and input/output ports can suddenly and unpredictably "choke" (create glitches in the sound or crash completely) if the user demands playback of "just that one more note." Consequently real-time, one-take performance is difficult to achieve from a large-scale 5.1 sample library.

Setting aside the practical aspects noted above for a moment, there are serious sonic issues even assuming one manages to get the prior art sample library playing satisfactorily and reliably. True 5.1 recordings of a sound have many open mics (that is, they have many microphones picking up and recording the sound). Not only do the mics pick up the sounds of the instruments, all these mics also pick up the sound of the room—which includes undesirable noise such as air conditioning rumble, coughs, flipping pages of music and shuffling feet. Besides room noise, for each "live" mic there is a degree of electronic noise present (even a simple carbon resistor generates electrical noise due to thermally-stimulated molecular activity). When one plays back a 5.1 recording of a typical complement of 25 spot and room microphones, one hears 25 mic's worth of electric noise, plus five or six times the ambient room noise. This noise is then multiplied by each note being played; add another note to a chord, and you get another dose of all that room and mic noise. Indeed, noise builds up rapidly, even with what seemed like a very quiet studio to the naked ear. Thus, even a genuine, well-recorded prior-art 5.1 sample library would not sound as good as would a live performance or a single-take recording of an orchestra with just one set of open mics that are heard just once. As discussed below, a sample used with the current invention has the sound picked up by only one mic (typically a spot mic) or two mics (a spot mic and a room mic).

Yet another problem occurs with conventional sampled libraries. Each individual recorded note is not simply stored in the sampler but rather it is digitally edited. In some cases this is done to make it possible to sustain a note (as if it were played by a bowed violin, a horn, or a piano with the sustain pedal depressed), however long the original recorded note might have been, for as long as a keyboard's key is held down.

Thus, instead of storing the full note, the sampler version has a truncated note, with the ends "chopped off" at precisely chosen times (or more accurately stated, precise locations in the sonic continuum of the note) selected so that the end of the note can be dove-tailed into the beginning of the note in a process known as "looping." When a key is released (i.e., when a note is no longer wanted), any looped sound ceases and the sampler now plays the "decay" or final portion of the recorded sound. With a conventionally recorded note's sound, the reverberation of the room in which the note was played is largely heard at the end of the note and is inextricably mixed with the sound of the note trailing off to silence. Sometimes the person playing these sampled notes wants the sound to end more quickly than was originally recorded, and so a sampler function can be invoked which truncates (chops off the decaying sound) at the end of such notes. Unfortunately, truncating a note causes a significant loss of the reverberant information as well so the impression of the size and depth of the recorded environment is lost. Using the subject invention to process recorded notes, even if they are truncated, overcomes the problem found with conventionally truncated samples in that the room characteristic is still present (i.e., added by the invention's processing that creates "lingering" reverberation when a note is released).

SUMMARY OF THE INVENTION

The instant invention allows the size of the apparent recording space to be scaled with continuous variability, in real time during playback, with no need to stop and retrieve alternate sound recordings. The instant invention has other benefits as well. The invention relies on a recording made either with one spot mic alone or with one spot and one room mic, and on a processor used upon playback to give broad control over apparent room size and sound source location within the apparent recording environment. However, the recorded sound itself needs no special encoding, no phase manipulation, and no additive or subtractive manipulation between the recorded tracks. This lack of manipulation of the sound being recorded is important in that sonic quality and image stability are not at all affected, issues that had been raised by certain prior art approaches to capturing multiple mics (or multiple channels such as with quadraphonic sound as described during the early 1970's in CBS' SQ™ and Sansui's QS™ matrix systems), storing them on fewer tracks (stereo), and then reconstituting the original channels upon playback; there is no complementary encoding-decoding in this invention, although there is signal processing upon playback.

Once the individual sound sources have been recorded with one or two microphones, the invention permits the real-time playback processing of multiple single-channel voices (i.e., digitally stored sounds) to place them in a 5.1 or 7.1 surround sound environment, although 9.1 surround (this is 7.1 with two additional side fill channels) or other playback formats are easily achieved using this same method. Each sound source can be placed in a realistic spatial relationship, or the apparent location can be arbitrarily moved to almost any "virtual" position regardless of where it was during the original recording, not just left-to-right but also front-to-rear.

The invention can function to some extent with any monaural or stereo recording but it works best when the sound being processed has been recorded with one spot microphone (or one spot microphone plus one room microphone in the two-channel format) as described herein. Because as little as one channel is needed to realistically produce a low-noise, high quality 5.1 or 7.1 surround playback environment, the amount of media needed to store recordings done in this fashion may be reduced, and it becomes easier to avoid exceeding the processor capability of the computers and samplers used to play back the samples. The nature of the process allows for a wide range of scaleability from a very small to a very large sonic space without compromise of quality, in real time, with smooth and continuous variability.

The spot mic bleed simulator portion of the invention processes the audio signal from a spot mic recording in order to simulate the audio bleed pickup of multiple microphones distributed among a plurality of predetermined spot mic location zones superimposed on a virtual sound stage. The spot mic bleed simulator includes a plurality of spot mic processors, preferably a spot mic processor for each one of the designated spot mic location zones, and each of these spot mic processors includes, among other elements, a series-connected spot mic low pass filter, spot mic delay and spot mic attenuator that together alter the original spot mic signal so it takes on the characteristic of a sound which would have been picked up by an actual spot mic at the location designated by the corresponding processor's zone. The output of each of these spot mic processors within the spot mic bleed simulator feeds a router and related output switching which together comprise a multiplexer that feeds summed subsets of these processed spot mic audio signals to one or more of the outputs of the mic bleed simulator system. In a similar manner the room mic bleed simulator processes the audio signal from a room mic recording in order to simulate the audio bleed pickup of multiple room microphones distributed among a plurality of predetermined room mic location zones superimposed on a virtual audience area, and feeds these signals through the invention's router-multiplexer, summers, and ultimately to one or more outputs of the mic bleed simulator system. Additionally, outputs of the spot mic bleed simulator and room mic bleed simulator may be routed and processed by the invention to derive rear surround outputs and subwoofer outputs when such outputs are designated as being active.

BRIEF DESCRIPTIONS OF THE DRAWINGS

FIG. 14 is a table with a particular set of CPU instructions for the spot mic simulator, the room mic simulator and the surround simulator corresponding to a particular recording environment, virtual source zone designation, and output configuration.

FIG. 15 is a table with a particular set of CPU instructions for to the main output mixer for the same recording environment, virtual source zone and output configuration as defined for FIG. 14.

DETAILED DESCRIPTION OF THE INVENTION

Figure 11:
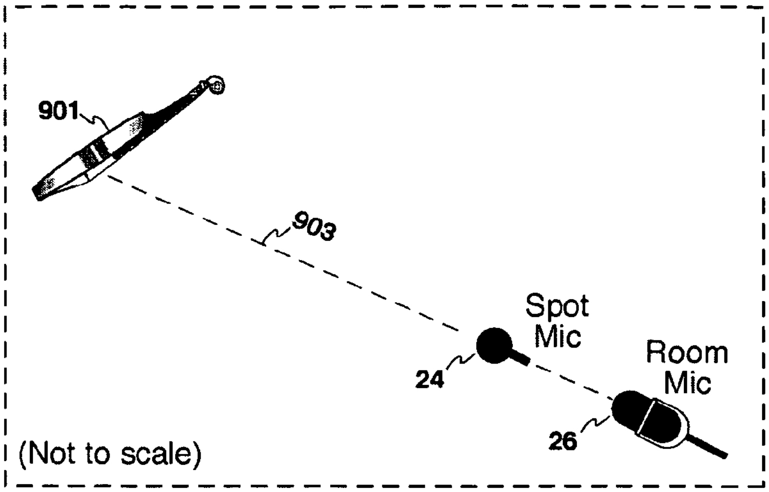
FIG. 11 is a top overhead view showing the alignment and position of the room and spot microphones when two microphones are used to record one instrument.
Figure 12:
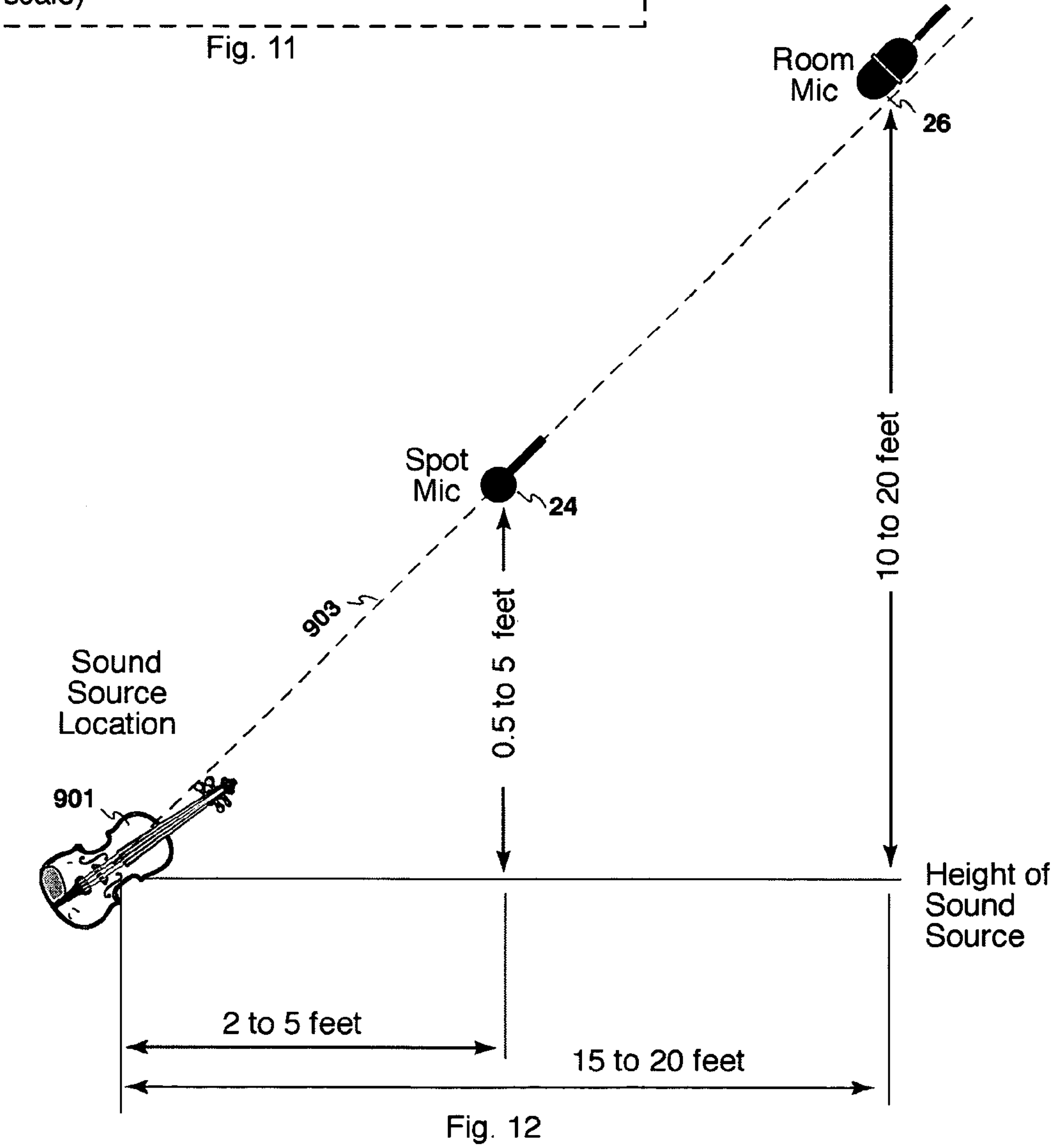
FIG. 12 is a side elevation view showing the alignment and position of the room and spot microphones when two microphones are used to record one instrument.

An example of a set up for making two-channel recordings for samples used with the invention is shown in FIGS. 11 and 12. In the example, the sound source is a single violin 901 which is being recorded in a studio which is about 20 feet wide×35 feet long by 30 feet high. Spot mic 24 is positioned 2 to 5 feet in front of and ½ to 5 feet above the center of the violin. The spot mic's capsule is pointed toward the center of the violin. Room mic 26 is positioned 15 to 20 feet in front of and 10 to 20 feet above the center of the violin. When viewed from above (as in FIG. 11), the room mic is co-linear with the violin and spot mic. The angle of the room mic's capsule with respect to imaginary horizontal and vertical axes is identical to that of the spot mic's capsule. However, when viewed from the side (as in FIG. 12), the room mic is offset from a line which would pass through the center of the violin and the spot mic. This avoids the room mic's capsule falling in the acoustic shadow of the spot mic. While this offset results in the room mic's capsule not pointing precisely at the center of the violin (in FIG. 12 the aiming line 903 of the spot mic's capsule points to the center of the violin, showing the slight offset of room mic 26), the phase relationship of the sounds (including reflections off of the floor) reaching the mics' capsules is preserved by the identical capsule angles.

The signals created by the spot mic and room mic are recorded on two separate channels of a high fidelity recording medium. The channel having the spot mic signal may be designated as the first channel or the spot mic channel, and the channel having the room mic signal may be designated as the second channel or the room mic channel. This two-channel recording is the basis for making digital two channel samples of the various notes played on the musical instrument during the recording session. The method for preparing the digital two-channel samples is essentially the same as used in preparing prior art stereo samples, except that instead of left and right channel signals, the two signals are spot and room mic signals (or, respectively, first and second channel audio signals).

A simplified microphone setup may be used with only the spot microphone 24 of FIG. 11 or FIG. 12, in which case the only difference in the recording setup is that there is no room microphone and only one channel of recording media is required.

Figure 10:
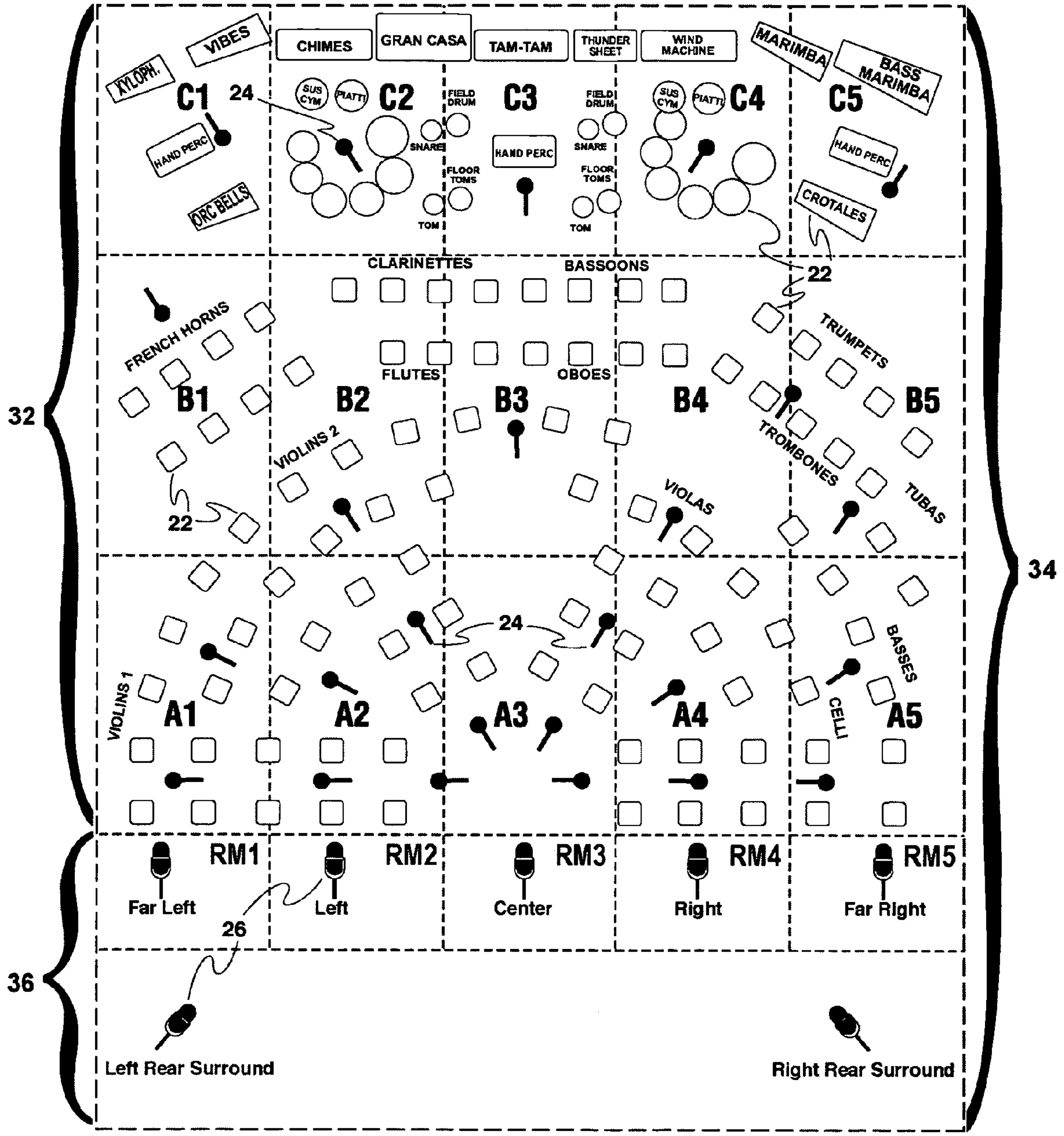
FIG. 10 is a top plan view of a typical arrangement of room and spot microphones and the instruments of a large orchestra in a sound recording studio for conventional recording, with a superimposed zone map that identifies the processing zones used in connection with the invention described herein.

FIG. 10 does double duty in this description. On the one hand, it depicts the layout of a traditional orchestral recording studio 34, with an illustration of where actual instruments, spot mics and room mics would be typically disposed in the stage portion 32 and the audience area 36. FIG. 10 also illustrates a virtual recording studio (also designated with reference number 34). Superimposed over the illustration of the stage portion 32 is a grid of 15 zones (bordered by dashed lines) which are designated as zones A1-A5, B1-B5 and C1-C5. These zones are virtual spot mic location zones A1-C5. The invented bleed simulator emulates the sound that would be picked up by a single spot mic located in the center of each of the 15 virtual spot mic zones.

Another grid divides the area immediately in front of the virtual stage into five virtual room mic location zones, RM1-RM5. These represent the placement of virtual room mics. The invented bleed simulator emulates the sound that would be picked up by a single room mic located in the center of each of the five virtual room mic zones.

For purposes of indicating the virtual location of a given sound source in the stage portion of the recording studio, another grid could be used to designate virtual source zone locations. The virtual source zones need not coincide with the virtual spot mic zones (e.g., there may be fewer or greater virtual source zones than virtual spot mic zones). However, in the preferred embodiment the virtual spot mic zones and virtual source zones are coincidental with each other. (Sometimes herein the virtual spot mic zones, virtual room mic zones and virtual source zones are referred to as processing zones.) For playback of a sample prepared in accordance with the above two-channel recording method, the sample is fed into the bleed simulator 110 of the instant invention shown in FIG. 1. (Single channel recorded samples are handled in a similar manner; the playback method variation for such samples is illustrated and discussed with FIG. 16.)

The bleed simulator comprises, an audio sample input 112, a virtual spot mic and virtual source zone designation input 114, a sound stage definition input 116, an output configuration designation input 118, an auxiliary subwoofer control input 120, and an auxiliary subwoofer input 122;

an audio sample buffer 124 which receives the audio sample input signal, which is comprised of the first and second audio channel signals (or the spot and room mic components), from the audio sample input 112;

a central processing unit (CPU) 126 which is connected to the virtual spot mic and virtual source zone designation input 114, sound stage definition input 116, output configuration designation input 118, and auxiliary subwoofer control input 120, and which is also bi-directionally connected to audio sample buffer 124 and memory location 128;

spot mic bleed simulator 130 which includes one spot mic processor per virtual spot mic zone location, of which there are fifteen in the embodiment of the instant invention depicted herein, designated 130*a* through 130*o*, each of which is connected to and receives a control signal from CPU 126 and is connected to and receives the first channel component of the audio sample signal (i.e., the spot mic component) from buffer 124, with each spot mic processor having an output connected to elements described below;

room mic bleed simulator 132 which includes a plurality of room mic processors, preferably one room mic processor per virtual room mic zone, of which there are five (5) in the embodiment of the invention depicted herein, designated 132*a*-132*e*, each of which is connected to and receives a control signal from CPU 126 and is connected to and receives the second audio channel component of the signal (i.e., the room mic component) from buffer 124, with each room mic processor having an output connected to elements described below;

router 133 which comprises a set of physical busses (or logical switching to accomplish the same function) to deliver sample signal components from the various spot mic bleed simulator processors and room mic bleed simulator processors to the main output mixer array, subwoofer output mixer and surround simulator;

main output mixer array 134 which includes far left main output mixer 134*a*, left main output mixer 134*b*, center main output mixer 134*c*, right main output mixer 134*d*, and far right main output mixer 134*e*, each of which is connected to and receives a control signal from CPU 126 and is connected to and receives processed first and second channel components of the audio sample signals (i.e., spot and room mic components) from all spot mic and room mic processors, with the processed audio sample signals flowing through switch arrays in the mixers which pass only suitable signals for the main output channels 136*a-e* of the bleed simulator;

subwoofer output mixer 138 which is connected to and receives a control signal from CPU 126, is connected to and receives the processed first channel component of the audio sample signal (i.e., the processed spot mic component) from all spot mic processors, and is connected to and receives an auxiliary audio signal (if one is present) from auxiliary subwoofer input 122, and which feeds the subwoofer output 140 of the bleed simulator; and surround output simulator 142 which includes rear left surround output mixer 142*a* and rear right surround output mixer 142*b*, each of which is connected to and receives a control signal from CPU 126. Rear left surround output mixer 142*a* is connected to and receives the processed second channel component of the audio sample signal (i.e., room mic component) from the outputs of far left room mic processor 132*a*, left room mic processor 132*b* and center room mic processor 132*c*, via their respective busses from router 133 and feed the rear right surround output 144*a* of the bleed simulator. Rear right surround output mixer 142*b* is connected to and receives the processed second channel component of the audio sample signal (i.e., room mic component) from the outputs of center room mic processor 132*c*, right room mic processor 132*d*, and far right room mic processor 132*e*, via their respective busses from router 133 and feeds the rear right surround output 144*b* of the bleed simulator.

Figure 1:
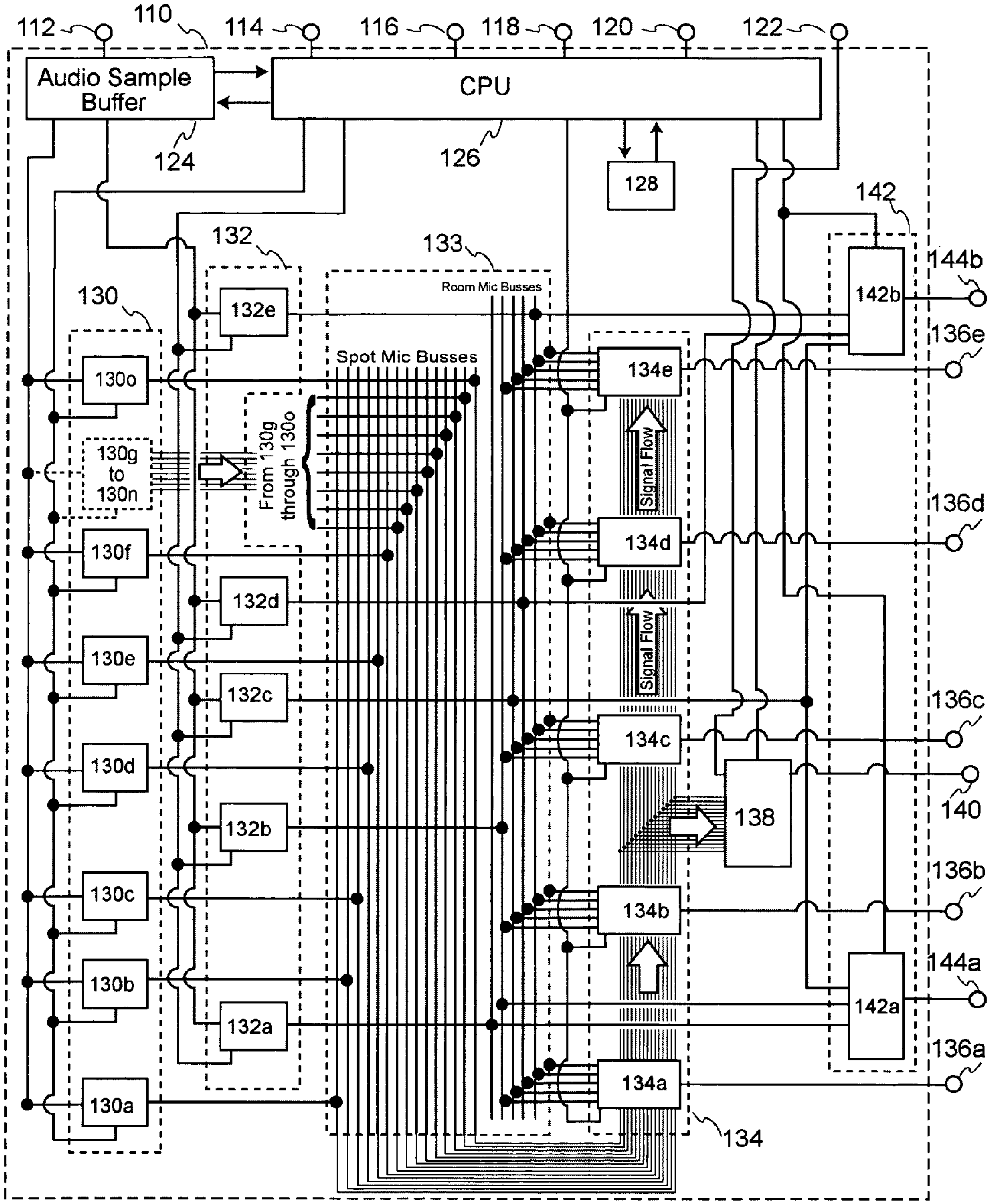
FIG. 1 is block diagram of the bleed simulator of the instant invention as configured for use with two-channel recordings created with one spot and one room microphone wherein each channel drives its respective (spot or room) mic simulator.

In viewing FIG. 1 (as well as FIG. 16), the signal flow lines represent a bus available simultaneously to all five output mixers and are not processed sequentially by these mixers.

Figure 2:
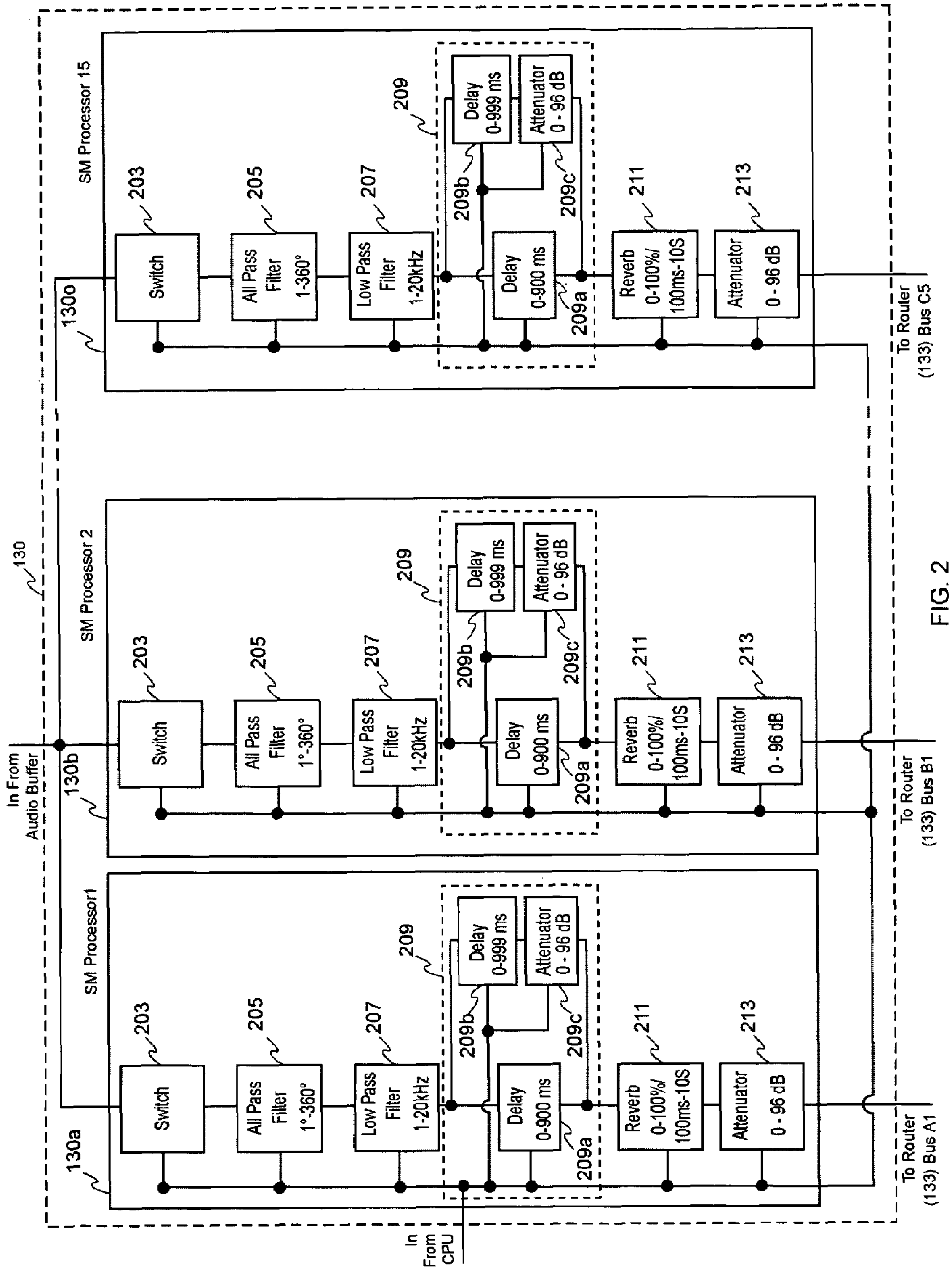
FIG. 2 is a detailed block diagram of a few of the spot mic processors within the spot mic simulator of the bleed simulator.
Figure 3:
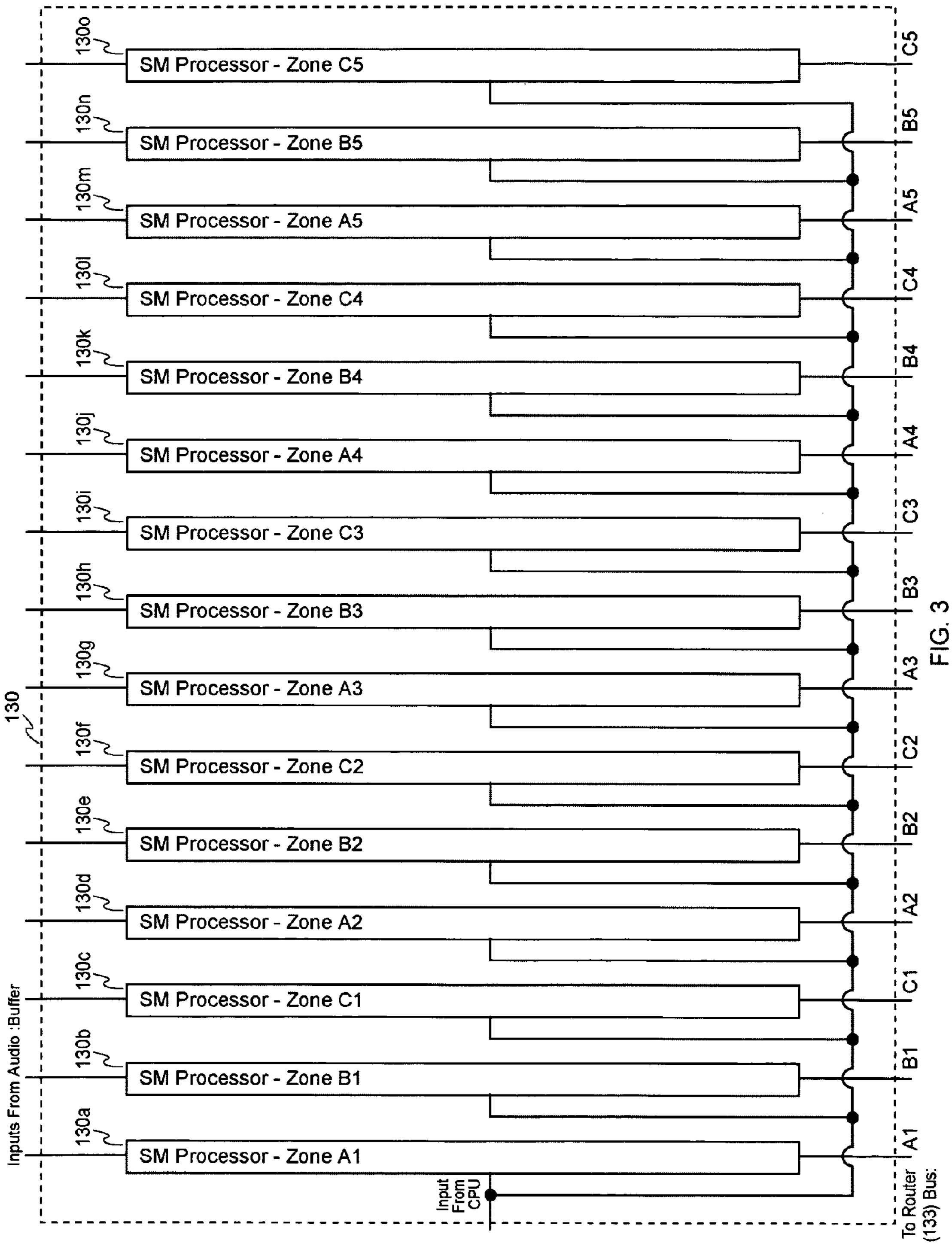
FIG. 3 is a block diagram of all the spot mic processors for a preferred embodiment of the bleed simulator.

The spot mic bleed simulator 130 is shown in more detail in FIGS. 2 and 3. As noted above, the spot mic bleed simulator includes fifteen (15) spot mic processors (virtual spot mic zone A1 spot mic processor 130*a*, zone B1 mic processor 130*b*, zone C1 spot mic processor 130*c*, zone A2 spot mic processor 130*d*, zone B2 mic processor 130*e*, zone C2 spot mic processor 130*f*, zone A3 spot mic processor 130*g*, zone B3 mic processor 130*h*, zone C3 spot mic processor 130*i*, zone A4 spot mic processor 130*j*, zone B4 mic processor 130*k*, zone C4 spot mic processor 130L, zone A5 spot mic processor 130*m*, zone B5 mic processor 130*n*, and zone C5 spot mic processor 130*o*), which number corresponds, in the illustrated embodiment, to the number of virtual spot mic zones into which the virtual sound stage is divided as shown in FIG. 10. Each spot mic processor includes the same elements, which elements are configured according to suitable stored information as explained below.

The number of processing zones actually used would depend on several factors, including the number of main outputs, the amount of computing power to be made available, and the degree of bleed simulation precision desired. The number of spot mic processors actually used could be fewer or greater than the number of virtual spot mic zones. The number used would also depend on several factors, including the number of main outputs, the amount of computing power to be made available, and the degree of bleed simulation precision desired.

For the types of simulations the inventors have contemplated, particularly with respect to orchestral arrangements in typical recording studios, the number of virtual spot mic zones is designated as fifteen, a compromise between adequate spatial resolution and conservation of computing resources. Similarly the inventors contemplate using in the spot mic bleed simulator one spot mic processor per virtual spot mic zone.

Each spot mic processor includes the following elements as shown in FIG. 2:

a switch 203 which receives the first channel component of the audio sample signal (in the example discussed here, the spot mic component of the audio sample signal, sometimes referred to as the "spot mic component") from the audio sample buffer 124;

an all pass filter 205, having a variable range of 1° to 360°, connected to switch 203 in series;

a low pass filter 207, having a variable range of 1 kHz to 20 kHz, connected to all pass filter 205 in series;

a delay circuit 209 connected to low pass filter 207 in series with respect to the spot mic component, with the delay circuit including a primary delay 209*a* with a range of 0 to 900 mSec connected in parallel with series-connected delay 209*b*, having a range of 0 to 999 mSec, and attenuator 209*c*, having a range of 0 to 96 dB;

a reverb 211, having a depth range of 0 to 100% modulation and a decay time range of 100 mSec to 10 Sec, connected in series with delay circuit 209; and another attenuator 213, having a range of 0 to 96 dB, connected in series with reverb 211.

The outputs of the attenuators 213 of each of the spot mic processors are applied to the spot mic busses of router 133.

Each of the elements, including both delays and the attenuator of the delay circuit, of a spot mic processor includes a control input which receives the control signal from CPU 126.

The control signal from CPU 126 sets the operating parameters of each of the various spot mic processor elements, depending upon the virtual source zone designated as the source of the sound represented by the audio sample, and with reference to memory location 128, which stores information relating to the parameter settings for room size, source zone location and output configuration. The information may be in the form of a lookup table such as shown in FIGS. 14 and 15 or the parameters may be calculated with the use of formulas. Using the lookup table of FIG. 14 (which corresponds to, among other things, a particular virtual source zone), the CPU would issue instructions such that switch 203 in spot mic processor 130*b* may be turned on (which would enable that particular processor), all pass filter 205 may be set to 120°, low pass filter 207 may be set to 12,000 Hz, delay 209*a* may be set to 16.400 msec, delay 209*b* may be set to 16.403 msec, attenuator 209*c* may be set to 17 dB of attenuation, reverb 211 may be set to 0% depth and hence the delay time (in seconds) is of no consequence, and attenuator 213 may be set to 15.6 dB of attenuation. In this example, the first channel component of the audio sample signal (i.e., the spot mic component) passing through spot mic processor 2 would shift in phase relative to the signal at input 112, would have reduced high frequency content, would be delayed and comb filtered, would have no added reverb, and would be reduced in amplitude.

The particular settings would correspond to control factors which are inputted to the CPU. Each spot mic processor receives its own set of instructions. When the outputs of all spot mic processors are routed and summed in accordance with the system shown and described, the desired spot mic bleed simulation is achieved.

Figure 4:
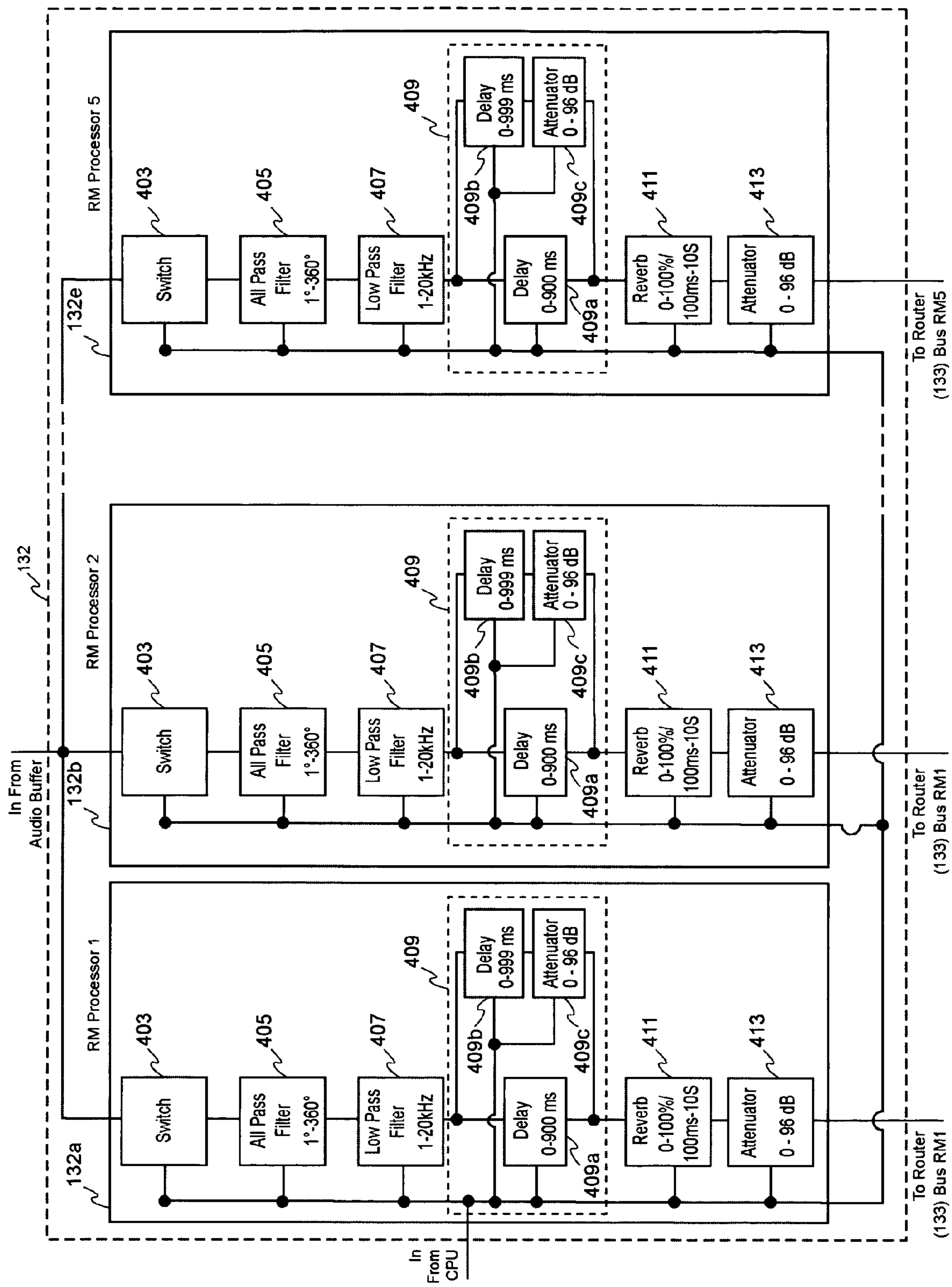
FIG. 4 is a detailed block diagram of a few of the room mic processors within the room mic simulator of the bleed simulator.
Figure 5:
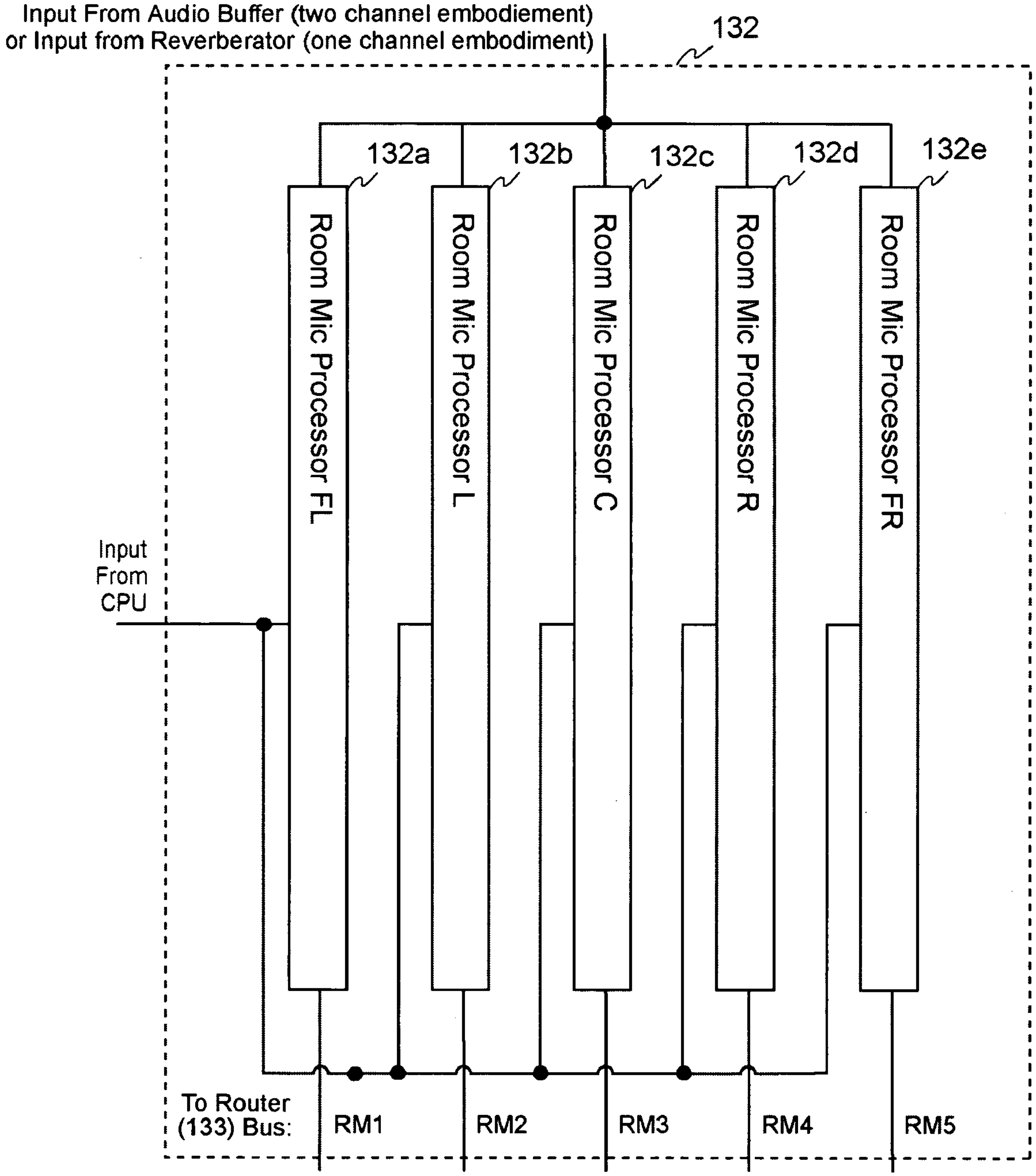
FIG. 5 is a block diagram of all the room mic processors for a preferred embodiment of the bleed simulator.

The room mic bleed simulator 132 is shown in more detail in FIGS. 4 and 5. As noted above, the room mic bleed simulator includes five (5) room mic processors (far left room mic processor 132*a*, left room mic processor 132*b*, center room mic processor 132*c*, right room mic processor 132*d*, and far right room mic processor 132*e*), which number corresponds, in the preferred embodiment, to the number of virtual room mic zones.

The number of room mic processors actually used could be fewer or greater than the number of virtual room mic zones. The number used would depend on several factors, including the number of main outputs, the amount of computing power to be made available, and the degree of bleed simulation precision desired. For the types of simulations the inventors have contemplated, they have found that five (5) room mic processors is a suitable quantity.

Each room mic processor includes the following elements as shown in FIG. 4:

- a switch 403 which receives the second channel component of the audio sample signal (in the example discussed here, the room mic component of the audio sample signal, sometimes referred to as the "room mic component") from the audio sample buffer 124;
- an all pass filter 405, having a variable range of 1° to 360°, connected to switch 403 in series;
- a low pass filter 407, having a variable range of 1 kHz to 20 kHz, connected to all pass filter 405 in series;
- a delay circuit 409 connected to low pass filter 407 in series with respect to the room mic component, with the delay circuit including a primary delay 409*a* with a range of 0 to 900 msec connected in parallel with series-connected delay 409*b*, having a range of 0 to 999 mSec, and attenuator 409*c*, having a range of 0 to 96 dB;
- a reverb 411, having a depth range of 0 to 100% modulation and a decay time range of 100 mSec to 10 Sec, connected in series; and
- another attenuator 413, having a range of 0 to 96 dB, connected in series with reverb 411.

The outputs of the attenuators 413 of each room mic processor are applied to the room mic busses of router 133.

Each of the elements, including both delays and the attenuator of the delay circuit, of a room mic processor includes a control input which receives the control signal from CPU 126.

Just as with the spot mic processors, the control signal from CPU 126 sets the operating parameters of each of the various room mic processor elements. For example, with reference to the lookup table of FIG. 14, switch 403 in center room mic processor 132*c* may be turned on (which enables this processor), all pass filter 405 may be set to 360°, low pass filter 407 may be set to 6,000 Hz, delay 409*a* may be set to 5.900 msec, delay 409*b* may be set to 5.917 msec, attenuator 409*c* may be set to 18 dB of attenuation, reverb 411 may be set to 0% depth and hence the delay time (in seconds) is of no consequence, and attenuator 413 may be set to 2.7 dB of attenuation. In this example, the second channel component of the audio sample signal (i.e., the room mic component) passing through the center room mic processor would have no shift in phase relative to the signal at input 112, would have reduced high frequency content, would be delayed and comb filtered, would have no added reverb, and would be reduced in amplitude.

As with the spot mic processors' settings, the particular room mic processor settings would correspond to control factors which are inputted to the CPU and stored in memory location 128, with each room mic processor receiving its own set of instructions. When the outputs of all room mic processors are routed and summed in accordance with the system shown and described, the desired room mic bleed simulation is achieved.

In the illustrated embodiment, the number of spot mic processors in the spot mic bleed simulator 130 equals the number of virtual spot mic location zones and the number of room mic processors in the room mic bleed simulator 132 equals the number of virtual room mic location zones. In the preferred embodiment (here for a 7.1 surround system) as shown in FIG. 1, there are fifteen (15) virtual spot mic zones, namely A1-5, B1-5 and C1-5, and five (5) virtual room mic zones, namely RM1-RM5. In an output configuration such as a 7.1 system, where all five main outputs are used, the output of each respective room mic processor is routed to all the main output mixers of main output mixer array 134 as shown in FIG. 1, namely far left main output mixer 134*a*, left main output mixer 134*b*, center main output mixer 134*c*, right main output mixer 134*d*, and far right main output mixer 134*e*, which are enabled such that the signal from each room mic processor flows only to a corresponding main output. Different output configurations such as a 3.1 or 2.0 system will result in varying the use of the main output mixers, and for this reason the main output mixer array is configured with logically-controlled switches to permit activation of any of the room mic processors to feed any of the main outputs. Similarly, the outputs of all spot mic processors are routed to each of the main output mixers and logically-controlled switches permit activation of any combination of the spot mic processors to feed any of the main outputs.

Figure 6:
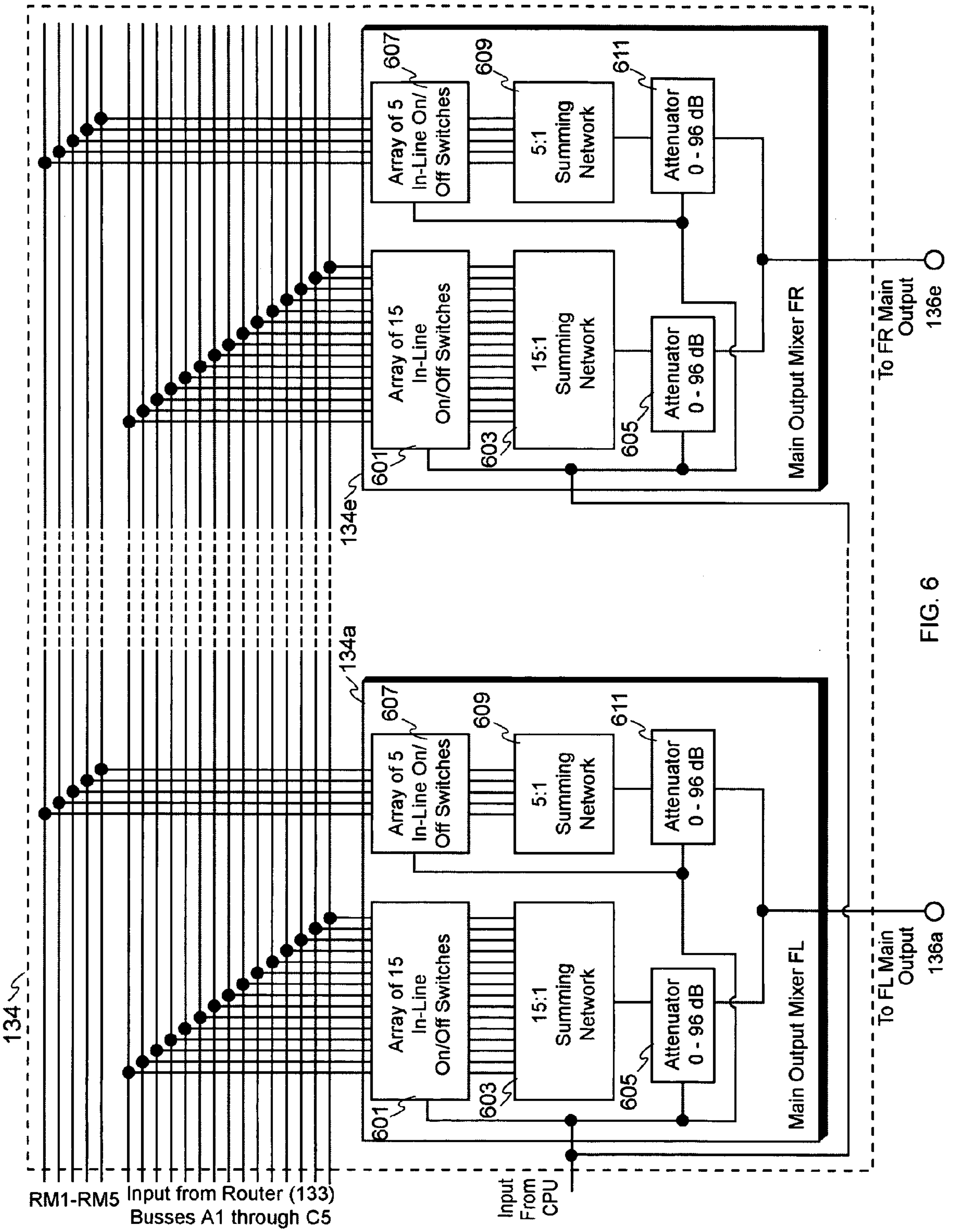
FIG. 6 is a detailed block diagram of two of the main output mixers of the bleed simulator.
Figure 7:
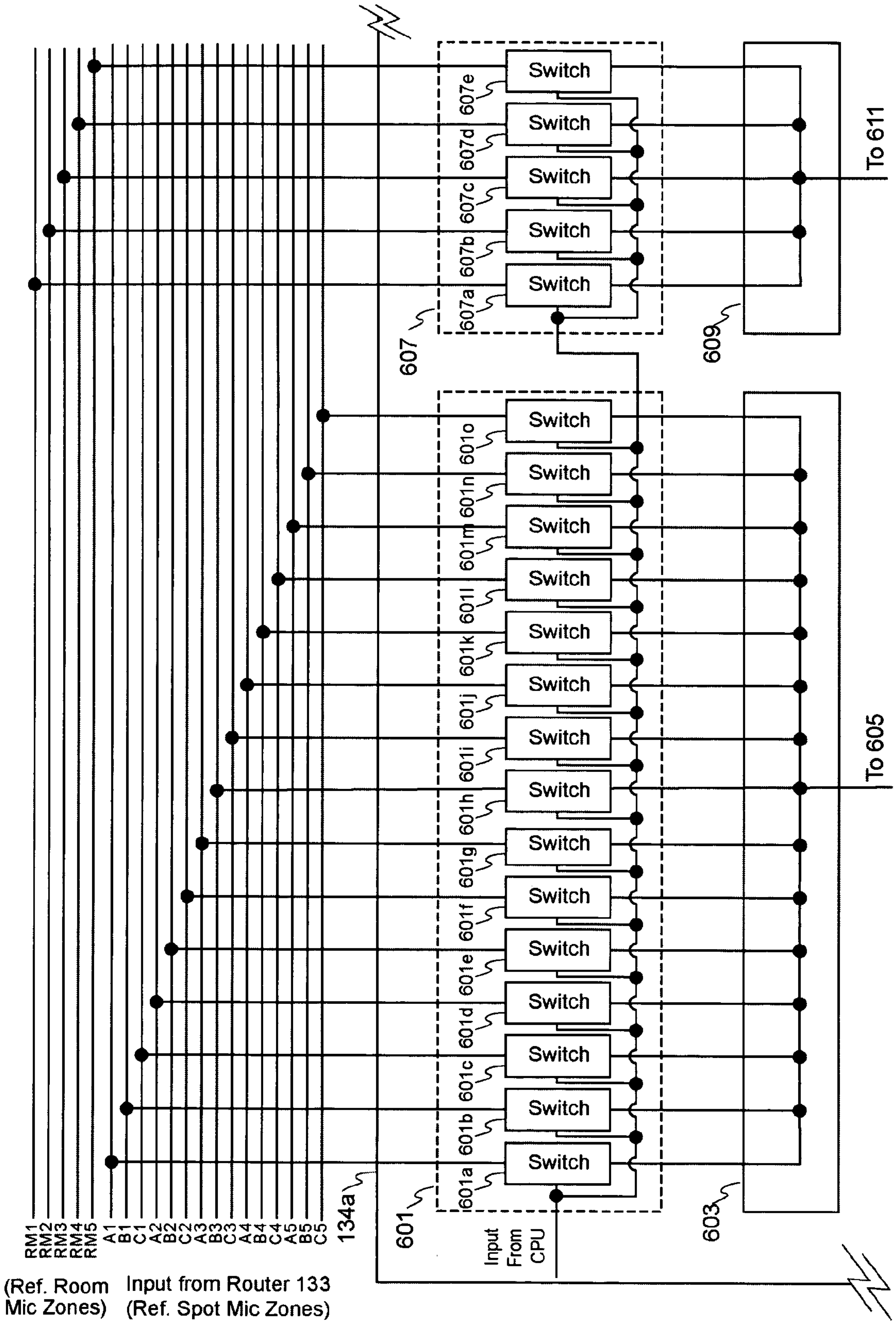
FIG. 7 is a detailed block diagram of the in-line on/off switch array and summing networks in one of the main output mixers.

The main output mixer array 134 is shown in detail in FIG. 6 and FIG. 7. Each main output mixer includes two pairs of switch arrays and summing networks (i.e., switch array 601 connected in series to summing network 603 and switch array 607 connected in series to summing network 609). FIG. 7 is an expanded view of these switch arrays and summing networks, the inputs of which are connected to the output mixer's spot mic component inputs and room mic component inputs, respectively. The summed output of each network in turn feeds, respectively, attenuators 605 and 611. The attenuation range of each of the attenuators is 0-96 dB. The outputs of the attenuators of an output mixer are summed together and fed to the corresponding main output of the bleed simulator (i.e., the output of far left main output mixer 134*a* is connected to the far left main output 136*a*, the output of left main output mixer 134*b* is connected to the left main output 136*b*, the output of center main output mixer 134*c* is connected to the center main output 136*c*, the output of right main output mixer 134*d* is connected to the right main output 136*d*, and the output of far right main output mixer 134*e* is connected to the far right main output 136*e*). Each of the elements of the main output mixers is connected to and receives a control signal from CPU 126.

The control signal from CPU 126 sets the operating parameters of each of the various main output mixer elements with reference to information stored in memory location 128. Based on the parameters, the relative contributions of the processed audio signal components from the spot mic and room mic processors may be adjusted to obtain a desired sound effect. Similarly, each switch would be controlled to enable or disable selected main output mixers to achieve a particular output configuration (e.g., shutting off all the on/off switches in arrays 601 and 607 of main output mixers 134*b* and 134*d* effectively reduces a 7.1 surround system to a 5.1 surround system; other switches in arrays 601 and 607 of main output mixers 134*a* and 134*e* would be turned on to avoid loss of desired sound components in this example).

Together the router 133 and main output mixer array 134 form a multiplexer.

Figure 8:
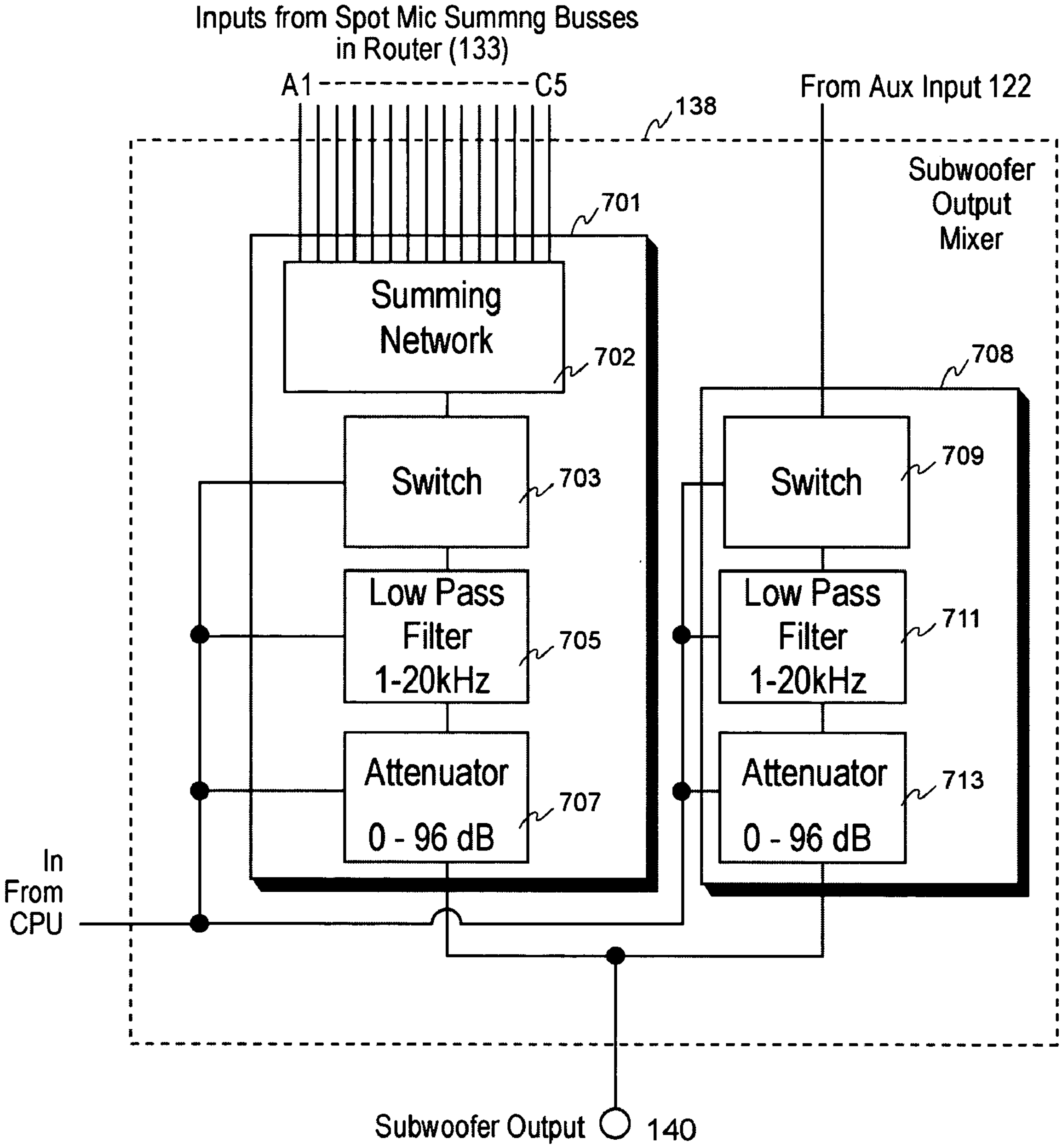
FIG. 8 is a block diagram of the subwoofer output mixer.

Subwoofer mixer 138 is shown in detail in FIG. 8. It includes a spot mic subwoofer processor 701 which is connected to and receives processed first channel (or spot mic) audio sample signal components from all the spot mic processors via feeds from the router. The spot mic subwoofer processor 701 includes a summing network 702 which sums together the processed first channel (or spot mic) audio sample signal components from all the spot mic processors, a switch 703 connected in series to the summing network, low pass filter 705, having a range of 1-20 kHz, connected in series to the switch 703, and attenuator 707, having a range of 0-96 dB, which is connected in series to the low pass filter. The subwoofer mixer also includes a subwoofer aux input processor 708 which is connected to and receives an auxiliary audio signal from auxiliary subwoofer input 122. The subwoofer aux input processor includes switch 709 which receives the auxiliary audio signal, low pass filter 711, having a range of 1-20 kHz, connected in series to the switch, and attenuator 713, having a range of 0-96 dB, which is connected in series to the low pass filter. The outputs of the spot mic subwoofer processor and the subwoofer aux input processor (i.e., the outputs of attenuators 707 and 713) are summed together and are fed to subwoofer output 140 of the bleed simulator.

Except for the summing network, each of the elements of the subwoofer mixer is connected to and receives a control signal from CPU 126. The control signal from CPU 126 sets the operating parameters of each of these elements with reference to information stored in memory location 128. Since the subwoofer mixer is intended to deliver a signal which would drive a very low frequency speaker, each of low pass filters 705 and 711 would typically be set at or below 125 Hz. The settings of the switches 703 and 709 and attenuators 707 and 713 determine the presence and balance of the spot mic and auxiliary audio contributions.

Figure 9:
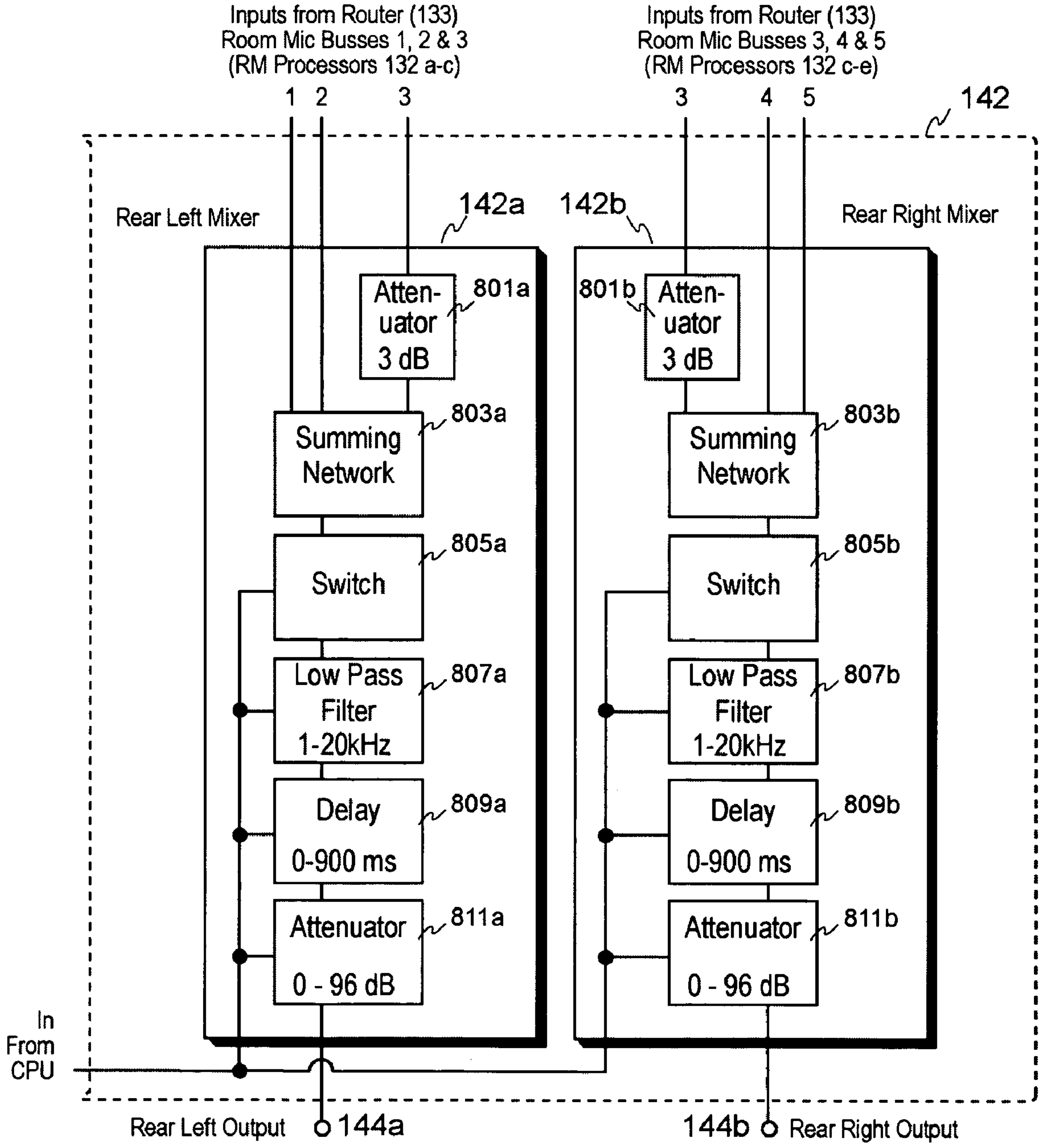
FIG. 9 is a block diagram of the surround simulator of the bleed simulator.

Surround output simulator 142 is shown in detail in FIG. 9. Rear left surround output mixer 142*a* includes attenuator 801*a* which is connected to and receives a processed second channel (or room mic) component of the audio sample signal from center room mic processor 132*c* via router 133. The rear left surround output mixer also includes summing network 803*a*, which is connected to and receives a processed second channel (or room mic) component of the audio sample signal from each of the far left room mic processor 132*a* and left room mic processor 132*b* via router 133, and also receives from attenuator 801*a* the processed and attenuated signal originating from center room mic processor 132*c*. The summed signals are fed to switch 805*a*, which is connected in series with the summing network 803*a*, low pass filter 807*a* (with a range of 1-20 kHz), delay 809*a* (with a range of 0-900 mSec), and attenuator 811*a* (having a range of 0-96 dB). The output of attenuator 811*a* is connected to the bleed simulator's rear left surround output 144*a*.

Rear right surround output mixer 142*b*, which includes attenuator 801*b*, summing network 803*b*, switch 805*b*, low pass filter 807*b*, delay 809*b* and attenuator 811*b*, is essentially identical to rear left surround output mixer 142*a*, except that where the inputs to summing network 803*a* are from the far left and left room mic processors, the inputs to the summing network 803*b* are from right and far right room mic processors 132*d* and 132*e*, respectively (also via router 133), and the output of attenuator 811*b* is connected to the bleed simulator's rear right surround output 144*b*.

The two surround (i.e., rear left and rear right) outputs both derive sound from the same center room mic processor. To avoid doubling in power of this contribution, attenuators 801*a* and 801*b* would typically each be fixed at 3 dB attenuation.

Switches 805*a* and 805*b*, low pass filters 807*a* and 807*b*, delays 809*a* and 809*b*, and attenuators 811*a* and 811*b* are each connected to and receive a control signal from CPU 126. The control signal from CPU 126 sets the operating parameters of each of these elements with reference to information stored in memory location 128. As long as surround sound is desired, switches 805*a* and 805*b* would be turned on, and if surround sound is not desired they would be turned off. As the simulated studio size in increased, low pass filters 807*a* and 807*b* in the preferred embodiment would be set at lower frequencies, while delays 809*a* and 809*b* would be increased. Attenuators 811*a* and 811*b* set the balance of surround to main output sound.

Before performing music with the bleed simulator, the user would provide to the bleed simulator the following setup information through inputs 114, 116, 118 and 120 shown in FIG. 1.

At input 120, the user enters information regarding whether the subwoofer aux input processor 708 should be enabled (i.e., whether switch 709 should be turned on). If the information indicates that the subwoofer aux input processor should be turned on, then the CPU-issued control signal would include an instruction for subwoofer aux input processor 708 to turn on its switch 709. If it is turned on, then any audio signal applied to input 122 would be processed and output by the bleed simulator at output 140.

At input 118, the user enters information regarding which output configuration should be enabled. For example, with respect to the embodiment of the bleed simulator illustrated in FIG. 1, if the user intends to use all of the outputs, this would be a 7.1 surround configuration. In such event, the CPU-issued control signal would include instructions for main output mixers 134*a-e*, spot mic subwoofer processor 701, and surround output simulator 142 such that appropriate switch elements in switch arrays 601 and 607 of the main output mixers 134*a-e*, switch 703 in spot mic subwoofer processor 701, and switches 805*a* and 805*b* in surround output mixer array 142 would be turned on. This would allow processed audio signals to appear at the far left, left, center, right and far right outputs, the subwoofer output and the left and right rear surround outputs. By way of another example, if the user intends to use only two channel stereo (i.e., which could be referred to as a 2.0 configuration), the CPU-issued control signal would include instructions for these elements that causes switch arrays 601 and 607 in main output mixers 134*b* and 134*d* to be turned on and switch arrays 601 and 607 in main output mixers 134*a*, 134*c* and 134*e*, switch 703 in spot mic subwoofer processor 701, and switches 805*a* and 805*b* in surround output mixer array 142 to be turned off. This would allow processed audio signals to appear on left and right outputs 136*b* and 136*d*, respectively, of the bleed simulator, but not on any other output.

At input 116, the user enters information about the nature of the virtual studio which the user wants to be simulated by the method and system described herein. Typically, such information would be the length, width and height of the simulated sound stage. It could also include additional information, such as information regarding the reverberance of the sound stage (e.g., whether its walls are acoustically absorptive or reflective). This information, stored in memory location 128, would result in the CPU-issued control signal to include instructions for the elements of the bleed simulator which would be used for a particular output configuration, which instructions would enable or disable appropriate switches and adjust appropriate delays, attenuators, filters and reverbs as necessary to achieve the desired effect. (This is discussed further below.)

At input 114, the user enters information about the number and layout of virtual spot mic zones and virtual source zones in the virtual recording studio 34 as shown for example in FIG. 10. (In the example discussed herein, as noted before, these two sets of zones are coincident.) In addition, for each separate sample which the user intends to use, the user enters the specific source zone in which the instrument(s) on that sample are intended by the user to be located. By way of example, the user may intend to be simulating the recording of an orchestra on a sound stage such as sound stage 32 shown in FIG. 10 which the user desires to have divided into fifteen virtual spot mic location zones and identical virtual source zones A1-5, B1-5 and C1-5. If for a particular sample of two violins (a particular desk as described above) the user desires the violins to be positioned at the far left front of the stage, the user would enter the source zone information for that sample as being "A1." This information would result in the CPU-issued control signal to include instructions for the elements of the spot mic bleed processors 130*a*-*o* and the room mic bleed processors 132*a*-*e* which would be used for a particular output configuration, which instructions would enable or disable appropriate switches and adjust appropriate delays, attenuators, filters and reverbs as necessary to achieve the desired effect. (This is discussed further below.)

By way of example, if the user desires that the instrument (or instruments) of a particular sample made pursuant to this invention (e.g., a desk of two violins) appear to be positioned in zone A1 of a virtual recording studio which is 40 feet wide, by 70 feet deep, by 35 foot high with virtual source zones and microphones laid out as shown in FIG. 10, and where the output configuration is a 7.1 surround sound system, the user would input the virtual spot mic zone layout information and the "A1" source zone designation at input 114, the sound stage description at input 116 and the output configuration at input 118, and when the audio sample signal is input at input 112, CPU 126 would issue instructions in accordance with the information depicted in the tables of FIG. 14 and FIG. 15. The CPU's associated memory 128 is used to store this data so it is available to provide instructions which control the performance of the elements of bleed simulator 110. Various sets of data may be stored and retrieved from non-volatile memory and loaded into memory location 128 so the invention can rapidly be set to simulate a particular virtual sound source location zone, output configuration and virtual recording environment.

In the specific example discussed here (where the sound source is in virtual source zone A1 of a virtual recording studio which is 40 feet wide, by 70 feet deep, by 35 foot high with virtual spot mic zones laid out as shown in FIG. 10), the look up tables of FIG. 14 and FIG. 15 show that the CPU will provide instructions which, among other things, cause the following (in reading the information shown in FIG. 14 and FIG. 15, it can be seen that units are not identified, but they are known by means of the memory location in which they are stored, and a dash ("—") indicates a null or non-applicable value):

For spot mic processor 130*a*, the CPU would issue instructions which

- turn on its switch 203;
- set its all pass filter 205 to 290°;
- set its low pass filter 207 to 20,000 Hz;
- set its primary delay 209*a* to 0.000 mSec;
- set its side-chain delay 209*b* to 0.003 msec;
- set its side-chain attenuator 209*c* to 18 dB of attenuation;
- set its reverb 211 to 0% reflection (and its delay time is thus null); and
- set its attenuator 213 to 0 dB of attenuation.

For spot mic processor 130*i*, the CPU would issue instructions which

- turn on its switch 203;
- set its all pass filter 205 to 360°;
- set its low pass filter 207 to 4,000 Hz;
- set its primary delay 209*a* to 35.900 mSec;
- set its side-chain delay 209*b* to 35.905 msec;
- set its side-chain attenuator 209*c* to 12.0 dB of attenuation;
- set its reverb 211 to 0% reflection (and its delay time is thus null); and
- set its attenuator 213 to 22.4 dB of attenuation.

For room mic processor 132*a*, the CPU would issue instructions which

- turn on its switch 403;
- set its all pass filter 405 to 360°;
- set its low pass filter 407 to 10,000 Hz;
- set its primary delay 409*a* to 0.000 mSec;
- set its side-chain delay 409*b* to 0.003 mSec;
- set its side-chain attenuator 409*c* to 24 dB of attenuation;
- set its reverb 411 to 0% reflection (and it delay time is thus null);
- set its attenuator 413 to 0 dB of attenuation.

For far right main output mixer 134*e* of main output mixer array 134, the CPU would issue instructions which

- turn on its switches 601*m*, 601*n* and 601*o* of while turning all other spot mic switches off;
- turn on its switch 607*e* while turning all other room mic switches off;
- set its spot mic component attenuator 605 to 20.6 dB of attenuation; and
- set its room mic component attenuator 611 to 6.3 dB of attenuation.

For rear left surround output mixer 142*a* of surround output simulator 142, the CPU would issue instructions which

- turn on its switch 805*a;*
- sets its low pass filter 807*a* at 3,000 Hz;
- sets its delay 809*a* to 20.1 mSec; and
- sets its attenuator 811*a* to 7.8 dB of attenuator.

For a given sized virtual recording studio, with particular virtual acoustic characteristics, and with virtual spot mic and source zones laid out as shown in FIG. 10, there would be fifteen sets of informational data (i.e., information per FIG. 14 and FIG. 15), one for each virtual source zone location. This data would be stored in memory location 128 accessible to the CPU. In the preferred embodiment the inventors anticipate that there will need to be as many as one pair of spot mic bleed simulator and room mic bleed simulator per virtual source zone (for the example discussed herein, fifteen (15) pairs) so that multiple different recordings with various virtual source locations can be processed simultaneously. While it is theoretically possible to do this by means of multiplexing the input sources and rapidly changing the simulator parameters (effectively virtually multiplying the number of spot mic and room mic bleed processing pairs by time slicing), considerations of presently available processor speed and circuit latency suggest this is not necessarily achievable for a large number of simultaneous, disparately-zoned, high-bandwidth audio signals.

For a virtual recording environment having the same virtual acoustic characteristics and with virtual spot mic and virtual source zones laid out as shown in FIG. 10, but larger in size than the example just discussed above (e.g., a virtual studio 55 feet wide, by 90 feet deep, by 40 foot high), at least some of the CPU instructions would be different from those given in the previous example. For example, the information for source zone A1 for that size virtual recording studio may result in the CPU issuing instructions to spot mic processor 130*i* as follows (with explanations of why some values are different from the values given for the previous example):

- turn on its switch 203;
- set its all pass filter 205 to 360°;
- set its low pass filter 207 to 3,500 Hz (because this larger room would have greater high frequency attenuation due to the greater distances between virtual spot mics);
- set its primary delay 209*a* to 37.2 mSec (because this larger room would have distances between virtual spot mics which would require a longer time for sound from a virtual source to reach a virtual spot mic in another zone);
- set its side-chain delay 209*b* to 37.204 mSec (for the same reason as for delay 209*a*);
- set its side-chain attenuator 209*c* to 11 dB of attenuation;
- set its reverb 211 to 10% reflection and 0.8 seconds decay time (because this larger room would, as a result of being larger, be more reverberant and since the ratio of reverberant to direct sound increases with distance from the sound source, the percentage of reverb would increase and the decay time would be related to the size of the room and distance from the sound source); and
- set its attenuator 213 to 23.5 dB of attenuation (because in this larger room the virtual spot mic corresponding to this processor is further from the virtual source location, the amplitude of the sound reaching this virtual spot mic would be lower).

The stored information controlling the processor would be developed by the provider of the system described herein.

The following factors are among those which may be used for establishing the information values. Some of them have already been discussed (e.g., length, width and height of the virtual recording studio, the virtual spot mic and room mic distribution in the virtual recording studio, the number and layout of the virtual source zones),

- length, width and height of the virtual recording studio;
- the reverberance of the virtual recording studio;
- the virtual spot mic and room mic distribution in the virtual recording studio;
- the directions in which the spot and room mics are aimed;
- the height of each mic above the floor;
- the sensitivity pattern of each mic;
- the frequency response of each mic;
- the output configuration (e.g., 2.0, 5.1 or 7.1 and the like); and
- the number and layout of the virtual source zones.

Figure 13:
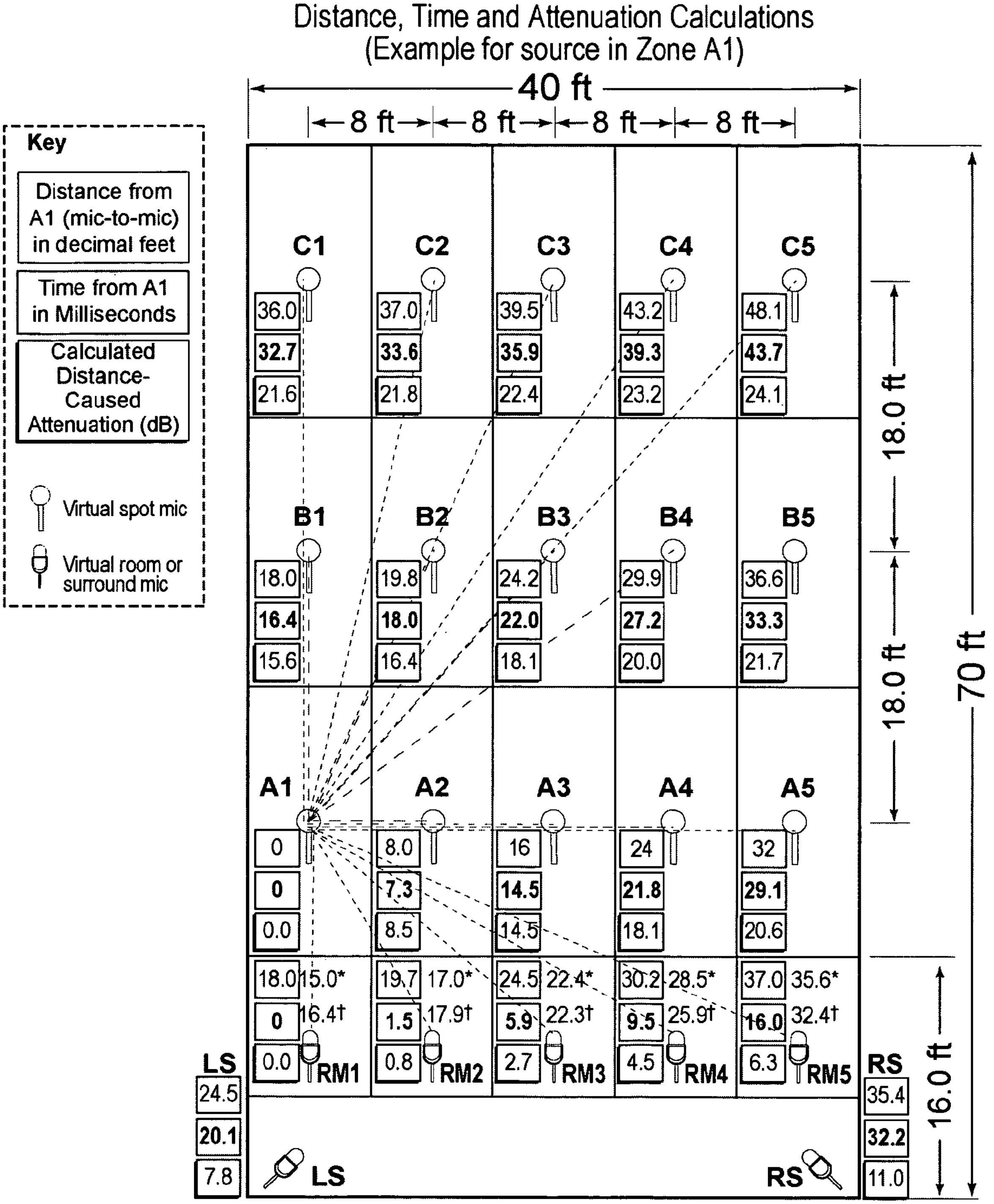
FIG. 13 is a top plan view of a simplified recording environment (similar to FIG. 10) with measured distances from a virtual instrument source in the middle of zone A1 to all other zones (representing virtual spot and room mics), and with calculated time-to-arrive for the sound from that source as well as calculated attenuation values for the sound at each virtual spot and room mic.

FIG. 13 depicts a method for determining preliminary (i.e., initial starting point) values for the time delay and attenuator information that would be associated with a particular virtual source zone and the virtual spot and room mic zones for control of the various spot and room microphone bleed processors within the spot and room mic bleed simulators. The overall virtual studio floor space measures 40 feet wide×70 feet deep, and the first 16 feet of depth is allocated for the room mics, including the surround mics. This leaves 54 feet for three front-to-back spot mic zones (A, B and C), and simple division suggests that there is therefore 18 feet depth for each of these zones.

All distances (between virtual spot mics, which are assumed to be at the center of each virtual source location zone) are expressed in feet. Since the 40-foot width of the studio is divided into five zones (B1 to B5 for example), each of these zones is 8 feet wide. Using simple geometric calculations (or measuring actual space if one wishes) the distance the center of source zone location A1 to each of the remaining 14 virtual spot mic locations is calculated (and shown in the uppermost box of the three values at the lower left corner of each zone). Using the standard temperature and pressure of air at sea level as an assumed condition, sound travels approximately 1.1 feet per millisecond, and so dividing the distance from A1 to each of the other 14 virtual spot mic locations by 1.1 yields the time in milliseconds for sound to reach each of those locations, as shown in the middle box of each zone. Because the distance from the virtual source to each of the other virtual spot mics is now known, using appropriate formulas the amount of sound attenuation can be approximated. The resulting attenuations (in dB) from the center of zone A1 to the center of other zones are shown in the bottom of the three values at the lower left corner of each zone.

The nearest of the virtual room mics is assumed to be 18 feet from the virtual sound source (this is calculated by estimating that it is 15 feet along the floor from the center of zone A1 to the point below virtual room mic RM1, but since RM1 is about 10 feet higher than the presumed height of the virtual sound source, the slant (diagonal) distance is 18 feet. With a two-audio channel (spot and room mic) recording, the room mic is already at a greater distance from the source, though, so one does not need to apply any attenuation to RM1 relative to A1. However, since the system is simulating RM2, RM3, RM4 and RM5 it needs to figure the additional amount of attenuation required for each of these virtual room mic locations based on their distances from A1. The same kind of slant range calculations are used to arrive at the upper box (feet) values in RM2 through RM5 (the uncorrected floor-only distances are shown adjacent to the boxes with an asterisk), and appropriate approximations are used to calculate the attenuation at each of these locations to be 0.8, 2.7, 4.5 and 6.3 dB respectively for RM2, RM3, RM4 and RM5. Finally, the delay necessary for each of the locations RM2 through RM5 is calculated by measuring using the slant range distance divided by 1.1, and then subtracting the time delay between A1 and RM1 since that delay is inherent in the second channel audio signal.

Figure 16:
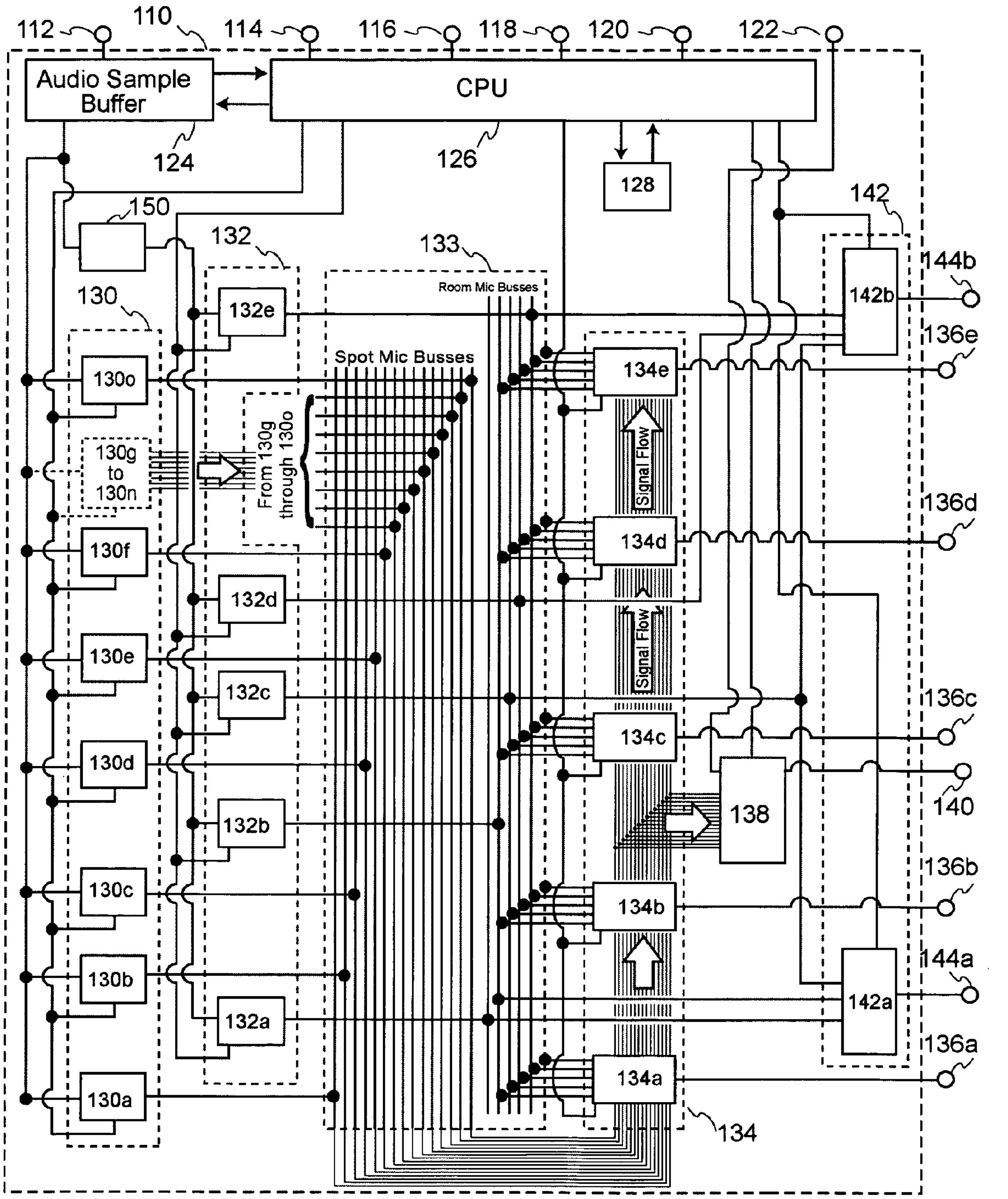
FIG. 16 is block diagram of the bleed simulator of the instant invention as configured for use with one-channel recordings.

In the embodiment where a first channel audio signal (spot mic) is reverbed to derive a simulated second channel audio signal (room mic), as shown in FIG. 16, the time delay between A1 and virtual RM1 is actually added to the first channel signal as part of the reverberator processing.

While calculations could be used to derive the data, it is expected that empirical testing and human listening tests will more likely be used to establish the stored information values such as shown in FIG. 14 and FIG. 15.

In the embodiment shown in FIG. 1, the information regarding the size and reverberance could be entered at input 116, the information regarding mic characteristics, virtual spot mic zones, and about the number and layout of the virtual source zones could be entered at input 114, and the information about output configuration could be entered at input 118. In other embodiments, other input facilities could be made available.

The system could be set so that a user could only input factor values which would correspond to existing stored data. On the other hand, the system could be configured to accept a wider range of input factor values. In such event, the CPU of the system could be configured to calculate intermediate values between stored data sets when the user has input factors which fall between system-provided parameters. In addition, the system can be provided with means for the user to make custom look up tables or to adjust (e.g., by scaling) the outputs of various elements to suit the user's needs.

With respect to subwoofer output mixer 138 shown in FIG. 8, the CPU would issue an instruction to turn on switch 703 whenever a "0.1" (dot one) output configuration is designated by the user. Low pass filter 705 and attenuator 707 would have default values, which values would be user adjustable. The CPU would issue instructions to turn on switch 709 depending upon the information entered at input 120 by the user. Low pass filter 711 and attenuator 713 would have default values, which values would be user adjustable.

While the bleed simulator of the invention could use separately recorded spot and room mic components, as described above in connection with FIGS. 1, 11 and 12, the invention can in fact work with only a recording from a spot mic (i.e., without a corresponding recording from a room mic). Such an embodiment, depicted in FIG. 16, depending upon circumstances (e.g., such as sample availability) may be a more appropriate choice. A simulated room mic component (or simulated second channel audio signal) can be derived from an audio sample signal originally consisting only of a spot mic signal by applying delay, reverb and possibly equalization (i.e., frequency response contouring) to the spot mic audio sample signal.

The elements comprising FIG. 16 are, with the exception of element 150, identical to the elements comprising FIG. 1, and so only the function and purpose of element 150 in FIG. 16 will be described. Whereas in the embodiment of FIG. 1 there were first and second channel audio signals applied to input 112, representing respectively the spot and room microphone signals, the embodiment of FIG. 16 has only a first channel audio signal applied to input 112, the spot microphone signal. In order to provide the necessary signal to the downstream components of the bleed simulator (i.e., room mic bleed simulator 132, output mixer array 134 and surround simulator 142) a second channel "room mic" audio signal is created by means of a reverberator processor 150. The reverberator processor applies: (1) a time delay corresponding to the time it would have taken for the signal emanating from the sound source to pass the spot mic and reach the room mic of FIG. 11 and FIG. 12, (2) a reverberation component corresponding to the additional acoustic reflections that represent the "room sound" that would have been sensed by the room mic 26 of FIG. 11 and FIG. 12, and (3) an equalization characteristic that accounts for the difference in spectral sensitivity between a typical directional spot mic 24 and a typical omni directional room mic 26 as well as for the natural development of greater bass response at a greater distance from the sound source due to the longer wavelength of low frequency sounds. In such an embodiment additional data may be stored in memory 128 for rapid recall of differing room mic models, different room mic locations relative to the spot mic, and different acoustic environments affecting the sound that would have been sensed by an actual room mic such as used in the embodiment of FIG. 1.

The various elements of the bleed simulator, such as the attenuators, filters, switches, reverbs and delays may implemented by various analog and/or digital means as is known by those having skill in the art (and, of course, as will become available to those skilled in the art in the future).

Many of the elements shown and discussed herein above have been described as if they were analog devices. However, those skilled in the art will recognize that with appropriate software the components may be implemented in a digital form. The use of analog or digital implementations will depend upon such factors as anticipated availability of computing power and memory, sonic quality of competing analog and digital systems, cost, and physical form factors. It is currently preferred to implement the components with digital means in a manner known to those skilled in the art of implementing digital audio circuits.

The invention described herein also includes the method of operating on audio signals described above to achieve microphone bleed simulation.

It will be understood that various changes of the details, materials, steps, arrangement of parts and uses which have been herein described and illustrated in order to explain the nature of the invention will occur to and may be made by those skilled in the art, and such changes are intended to be included within the scope of this invention.

We claim the following:

1. A bleed simulator system for playing an audio signal to simulate the audio bleed pickup of multiple microphones distributed among a plurality of predetermined virtual spot mic location zones and virtual room mic location zones associated with a virtual sound stage, said system comprising, at least one bleed simulator output;

a spot mic bleed simulator which receives as an input said audio signal and outputs a plurality of processed audio signals, said spot mic bleed simulator including a plurality of spot mic processors, each of said spot mic processors having a series-connected spot mic low pass filter, spot mic delay and spot mic attenuator;

a reverb which receives as an input said audio signal and outputs a reverbed audio signal;

a room mic bleed simulator which receives as an input said reverbed audio signal and outputs a plurality of processed reverbed audio signals, said room mic bleed simulator including a plurality of room mic processors, each of said room mic processors having a series-connected room mic low pass filter, room mic delay and room mic attenuator; and a multiplexer connected to said spot mic bleed simulator and to said room mic bleed simulator, which multiplexer receives said plurality of processed audio signals and said plurality of processed reverbed audio signals, and which multiplexer outputs summed subsets of said processed audio signals and said plurality of processed reverbed audio signals to at least one of the outputs of said bleed simulator system.

2. The bleed simulator system of said claim 1 wherein said spot mic bleed simulator includes a spot mic processor for each one of said plurality of virtual spot mic location zones and said room mic bleed simulator includes a room mic processor for each one of said plurality of virtual room mic location zones.

3. The bleed simulator system of claims 2 further comprising a CPU connected to each spot mic processor and each room mic processor, said CPU issuing instructions which control the settings of the sport and room mic processors.

4. The bleed simulator system of claim 3 further comprising a memory in communication with said CPU, which memory stores information corresponding to virtual sound stage definitions and virtual source zone designations, wherein said CPU issues instructions to said spot and room mic processors based on said information associated with a selected virtual sound stage definition and source zone designation.

5. The bleed simulator system of any one of claims 1-4 wherein said virtual sound stage is divided into a predetermined number of virtual source zones and wherein said bleed simulator system includes a number of spot mic bleed simulators equal to said predetermined number of virtual source zones and a number of room mic bleed simulators equal to said predetermined number of virtual source zones.

* * * * *